(12) United States Patent
Yamate

(10) Patent No.: US 7,977,149 B2
(45) Date of Patent: Jul. 12, 2011

(54) TRANSISTOR, ORGANIC SEMICONDUCTOR DEVICE, AND METHOD FOR MANUFACTURE OF THE TRANSISTOR OR DEVICE

(75) Inventor: Shinichi Yamate, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 12/065,007

(22) PCT Filed: Aug. 30, 2006

(86) PCT No.: PCT/JP2006/317130
§ 371 (c)(1),
(2), (4) Date: Feb. 27, 2008

(87) PCT Pub. No.: WO2007/026778
PCT Pub. Date: Mar. 8, 2007

(65) Prior Publication Data
US 2009/0278116 A1    Nov. 12, 2009

(30) Foreign Application Priority Data
Aug. 31, 2005 (JP) .............................. P2005-251684

(51) Int. Cl.
*H01L 51/40* (2006.01)
(52) U.S. Cl. ...... 438/99; 438/197; 257/40; 257/E21.299
(58) Field of Classification Search ............... 438/99, 438/82, 197; 257/40, 82, 288, E51.001, E51.003, 257/E51.006, E21.299, E21.409, E29.09
See application file for complete search history.

(56) References Cited

U.S. PATENT DOCUMENTS

| 6,107,117 | A | 8/2000 | Bao et al. | |
| 6,885,024 | B2* | 4/2005 | Bao et al. | 438/99 |
| 2005/0000353 | A1 | 1/2005 | Nemser | |
| 2005/0064623 | A1* | 3/2005 | Bao | 438/99 |

(Continued)

FOREIGN PATENT DOCUMENTS

CN    1453636 A    11/2003

(Continued)

OTHER PUBLICATIONS

Vikram C. Sundar et al., "Elastomeric Transistor Stamps: Reversible Probing of Charge Transport in Organic Crystals", Science, vol. 303, (2004), pp. 1644-1646.

(Continued)

*Primary Examiner* — Evan Pert
*Assistant Examiner* — Eduardo A Rodela
(74) *Attorney, Agent, or Firm* — Sughrue Mion, PLLC

(57) ABSTRACT

The invention provides a process for production of a transistor and an organic semiconductor element which allows satisfactory formation of active layers on desired surfaces, even if the active layers are organic semiconductor compound-containing active layers imparted with prescribed properties beforehand. A preferred mode of the process for production of a transistor is a process for production of a transistor provided with a source electrode and drain electrode, an active layer containing an organic semiconductor compound as a current channel between the electrodes, a gate electrode that controls the current flowing through the current channel and an insulating layer disposed between the active layer and gate electrode, wherein the process includes a pasting step in which a working liquid is situated between the active layer and insulating layer and the active layer and insulating layer are attached together.

20 Claims, 19 Drawing Sheets

U.S. PATENT DOCUMENTS

2006/0024860 A1 * 2/2006 Wada et al. .................. 438/99

FOREIGN PATENT DOCUMENTS

| JP | 2004-006476 A | 1/2004 |
|----|---------------|--------|
| JP | 2004-146430 A | 5/2004 |
| JP | 2005-101520 A | 4/2005 |
| JP | 2005-123290 A | 5/2005 |

OTHER PUBLICATIONS

Michael L. Chabinyc et al., "Lamination Method for the Study of Interfaces in Polymeric Thin Film Transistors", Journal of the American Chemical Society, vol. 126, (2004), pp. 13928-13929.

S. Matsumoto et al., "Liquid Crystal Fundamentals and Applications", Kogyo Chosakai Publishing, (1991), pp. 95-105.

A. Fukuda et al., "Structures and Properties of Ferroelectric Liquid Crystals", Corona Publishing, (1990), pp. 227-269.

"Liquid Crystals", vol. 3, No. 1, (1999), pp. 3-16.

S.R. Wasserman et al., "Structure and Reactivity of Alkylsiloxane Monolayers Formed by Reaction of Alkyltrichlorosilanes on Silicon Substrates", Langmuir, vol. 5, (1989), pp. 1074-1087.

P. Dyreklev et al., "Aligned Polymer Chain Field Effect Transistors", Solid State Communications, vol. 82, No. 5, (1992), pp. 317-320.

P. Dyreklev et al., "Polymeric Field Effect Transistors Using Oriented Polymers", Synthetic Metals, 55-57, (1993), pp. 4093-4098.

Yong-Young Noh, et al., "Organic Field-Effect Transistors by a Wet-Transferring Method," Applied Physics Letters, Aug. 11, 2003, pp. 8-10, vol. 83, No. 6, American Institute of Physics.

Lin, Y. et al. Stacked Pentacene Layer Organic Thin-Film Transistors with Improved Characteristics, IEEE Electron Device Letters, Dec. 1997, vol. 18, No. 12, pp. 606-608.

* cited by examiner (e)

(f)

(a)

(b)

(c)

(d)

(e)

(a)

(b)

(c)

TRANSISTOR, ORGANIC SEMICONDUCTOR DEVICE, AND METHOD FOR MANUFACTURE OF THE TRANSISTOR OR DEVICE

TECHNICAL FIELD

The present invention relates to a transistor and an organic semiconductor element, and to a process for their production.

BACKGROUND ART

Organic semiconductor elements are elements with active layers containing organic semiconductor compounds. The active layers of such organic semiconductor elements have conventionally been formed by several different processes. For example, known processes for forming active layers in field-effect transistors, as typical types of organic semiconductor elements, include processes involving vapor deposition of organic semiconductor compound powders on insulating layers, and processes involving spin coating, drop casting or printing of solvent-dissolved organic semiconductor compound solutions on insulating layers (Non-patent document 1).

There is also known a process wherein a thin-film of an organic semiconductor compound is formed on a donor substrate and subjected to pressure and heat for stamp transfer of the thin-film onto an insulating layer with a source electrode and drain electrode (Patent document 1).

Another process that has been reported involves forming an organic semiconductor compound thin-film for the active layer on a silicon wafer, copying it onto a 1-5 mm thick polydimethylsiloxane rubber stamp and pasting it with the stamp onto an insulating layer to form an active layer (Non-patent document 2).

Another process is known wherein after formation of an organic semiconductor compound single crystal, it is attached onto an insulating layer provided with a source electrode and drain electrode (Non-patent document 3).

[Patent document 1] U.S. Patent Application Publication No. 2005/0035374

[Non-patent document 1] Michael L. Chabinyc et al., Journal of the American Chemical Society, Vol.126, p 13928-p 13929, 2004

[Non-patent document 2] Vikram C. Sundar et al., Science, Vol.303, p 1644-p 1646, 2004

[Non-patent document 3] Vikram C. Sundar et al., Science, Vol.303, p 1644-p 1646, 2004

DISCLOSURE OF THE INVENTION

Problems to be Solved by the Invention

The properties of the active layer that contains the organic semiconductor compound have a major influence on the performance of the organic semiconductor element. However, it has been difficult to form active layers with the desired performance using an active layer forming process by vapor deposition or solution coating as described in Non-patent document 1. It has also been difficult to accomplish satisfactory transfer or pasting in the transfer or pasting processes described in Patent document 1 and Non-patent documents 2 and 3.

For example, in a transistor such as mentioned above, it is known that the active layer should be oriented for high carrier mobility. Yet coating and vapor deposition do not allow easy formation of active layers oriented in such a manner. With pre-oriented active layers it has been difficult to accomplish sufficient transfer or pasting onto the insulating layers.

The present invention was devised in this context and its object is to provide a process for production of a transistor and an organic semiconductor element which allows satisfactory formation of active layers with desired characteristics on surfaces where the active layer is to be formed. The invention further provides a transistor and organic semiconductor element obtained by the aforementioned production process.

Means for Solving the Problems

In order to achieve these objects, the invention provides a process for production of a transistor provided with a source electrode and drain electrode, an active layer containing an organic semiconductor compound as a current channel between the electrodes, a gate electrode that controls the current flowing through the current channel and an insulating layer disposed between the active layer and gate electrode, the process being characterized by including a pasting step wherein a working liquid is situated between the active layer and insulating layer and the active layer and insulating layer are attached together.

Since a working liquid is situated between the active layer and insulating layer in this production process, their contact surfaces are wetted by the working liquid and the active layer can therefore be satisfactorily pasted onto the insulating layer. As a result, it is possible to accomplish satisfactory pasting of even an oriented active layer onto any desired surface, such as that of an insulating layer. Using the working liquid allows satisfactory pasting even when the active layer is distorted, for example, so that the degree of freedom during production is increased. When active layers have been formed by transfer or pasting in the prior art, excessive pressure has been required to adequately bond them to the forming surface, and this has led to potential reduction in the active layer properties or deformation and defects in the elements such as the transistors. Using the working liquid according to the invention, however, it is possible to satisfactorily paste the active layer without pressure, so that such problems due to excessive pressure do not occur. In addition, using a working liquid improves the adhesiveness between the active layer and the surface on which it is formed.

According to the production process described above, it is important that the entire active layer does not elute into the working liquid when the active layer and insulating layer are attached together via the working liquid. This can be easily controlled by appropriate selection of the amount of working liquid and the solubility of the working liquid.

The working liquid is preferably one with a contact angle of no greater than 120 degrees, more preferably no greater than 90 degrees and even more preferably no greater than 60 degrees with the insulating layer. A working liquid satisfying this condition can more satisfactorily wet the surface of the insulating layer, resulting in more favorable attachment between the active layer and insulating layer.

The active layer that is attached in the pasting step is preferably one that has been formed on a support film. That is, preferably a laminated body comprising an active layer formed on a support film is used with the active layer situated facing the insulating layer, attaching the active layer and insulating layer together with the working liquid situated between them. Because the active layer is already supported on the support film, it is easily manageable and attachment of the active layer and insulating layer is thus facilitated.

The pasting step in the production process of the invention may be followed by a removal step for removal of the volatilizing components in the working liquid. In this case, the working liquid may consist only of volatilizing components or of a mixture of volatilizing components and non-volatilizing components. The volatilizing components may be completely removed, or only a portion thereof may be removed. When the working liquid contains non-volatilizing components, the non-volatilizing components are present near the interface between the active layer and the insulating layer, and a portion thereof become incorporated in the active layer and/or insulating layer.

Heating and/or pressing may also be carried out during the pasting step. Suitable heating or pressing during attachment can improve the adhesiveness between the active layer and insulating layer, and accelerate removal of the working liquid. However, as mentioned above, the invention allows satisfactory attachment to be accomplished by the intervening working liquid, so that excessive heating and pressing are unnecessary. The pasting step may be carried out under reduced pressure, for the purpose of further improving the adhesiveness and accelerating removal of the working liquid.

The active layer used in the production process of the invention is preferably an oriented layer. The use of a working liquid according to the invention allows satisfactory pasting to be accomplished even with an oriented active layer. Moreover, since the active layer can be prepared with the desired orientation according to the invention, it is easy to obtain satisfactory carrier mobility for transistors.

The transistor production process of the invention can also be applied for formation of transistors with active layers on layers other than insulating layers. Specifically, the process for production of a transistor according to the invention is a process for production of a transistor provided with a source electrode and drain electrode, an active layer containing an organic semiconductor compound as a current channel between the electrodes, and a gate electrode that controls the current flowing through the current channel, the process being characterized by including a pasting step wherein the active layer is attached to the surface where the active layer is to be formed, with the working liquid situated between it and the surface. According to this production process, the working liquid allows even an oriented active layer to be satisfactorily pasted onto the surface where it is to be formed.

The transistor produced by the production process of the invention may also have a layer composed of a compound different from the organic semiconductor compound, between the source electrode and/or drain electrode and the active layer, for example. Providing such a layer can reduce the contact resistance between the active layer, which contains the organic semiconductor compound and functions as the carrier transport layer, and the source and drain electrodes.

The production process described above which includes a pasting step using the working liquid may be applied not only to transistors but also to different types of organic semiconductor elements. That is, the process for production of an organic semiconductor element according to the invention is a process for production of an organic semiconductor element with an active layer containing an organic semiconductor compound, characterized by including a pasting step in which the active layer is attached to its adjacent layer with a working liquid situated between them.

According to this production process, it is possible to satisfactorily form an active layer with excellent characteristics by pasting via the working liquid, similar to the transistor described above. The preferred conditions for this organic semiconductor element production process (the contact angle with the layer adjacent to the working liquid, the structure of the active layer, etc.) are the same as for production of a transistor.

As such organic semiconductor elements in addition to transistors, there may be mentioned diodes, photodiodes, solar cells, light emitting diodes, memory chips, luminescent transistors, sensors and the like. Transistors according to the invention are not particularly restricted and include bipolar transistors, static induction transistors, field-effect transistors and the like.

The invention further provides a transistor and organic semiconductor element obtained by the aforementioned production process of the invention. Specifically, the transistor according to the invention is characterized by comprising a source electrode and drain electrode, an active layer containing an organic semiconductor compound as a current channel between the electrodes, a gate electrode that controls the current flowing through the current channel and an insulating layer disposed between the active layer and gate electrode, wherein the active layer and insulating layer are attached via a working liquid situated between them.

As mentioned above, the transistor does not necessarily require an insulating layer. That is, the transistor according to the invention may be a transistor comprising a source electrode and drain electrode, an active layer containing an organic semiconductor compound as a current channel between the electrodes and a gate electrode that controls the current flowing through the current channel, wherein the active layer is attached to the surface where the active layer is to be formed, with the working liquid situated between it and the surface.

The organic semiconductor element of the invention is an organic semiconductor element with an active layer containing an organic semiconductor compound, characterized in that the active layer is attached to the surface on which it is to be formed with a working liquid situated between it and the surface.

Since the transistor and organic semiconductor element obtained in the manner described above have the active layer attached to the intended surface (insulating layer surface, for example) via the working liquid, formation can be satisfactorily accomplished while maintaining the properties of the active layer even if it has been oriented prior to pasting. In the case of a transistor, for example, orientation of the active layer can result in superior carrier mobility.

In the aforementioned transistor and organic semiconductor element of the invention, the working liquid is preferably one with a contact angle of no greater than 120 degrees and more preferably no greater than 90 degrees with the surface on which the active layer is formed (for example, an insulating layer). The active layer is preferably an oriented an active layer.

The transistor of the invention may also have a layer composed of a compound different from the organic semiconductor compound, between the source electrode and/or drain electrode and the active layer, for example. As mentioned above, this can reduce the contact resistance between the source and drain electrodes and the active layer.

Effect of the Invention

According to the invention it is possible to provide a process for production of a transistor and an organic semiconductor element which allows satisfactory formation of active layers on surfaces where the active layer is to be formed, even for organic semiconductor compound-containing active layers imparted with specified properties beforehand. According

EXPLANATION OF SYMBOLS

Figure 1:
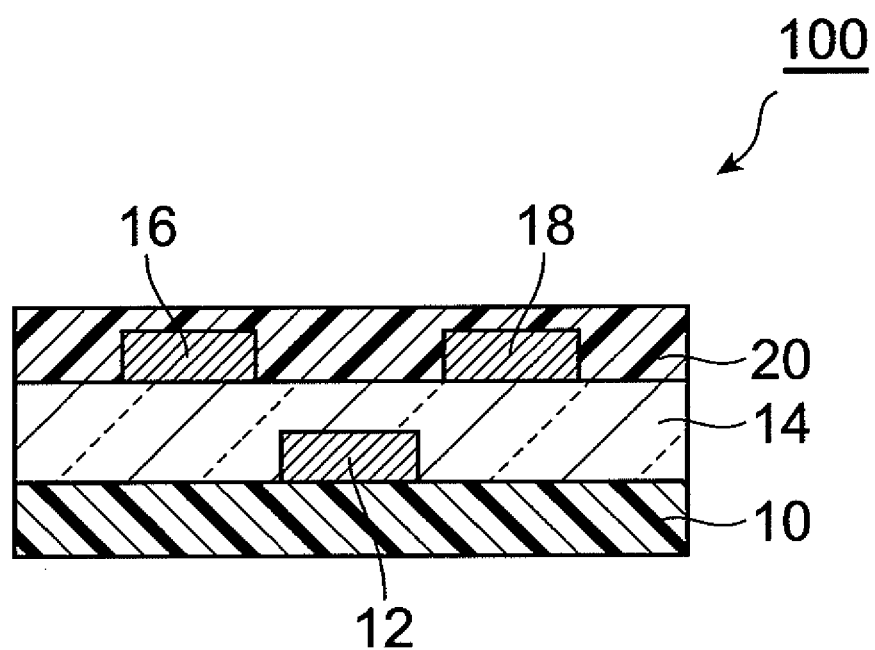
FIG. 1 is a schematic cross-sectional view of a transistor according to a first embodiment of the invention.

1: n-type silicon substrate, 2: active layer, 3: insulating layer, 4a: source electrode, 4b: drain electrode, 5: laminated body, 6: element board, 7: support film, 8: poly(3-hexylthiophene) film, 9: working liquid, 10: substrate, 12: gate electrode, 14: insulating layer, 16: source electrode, 18: drain electrode, 20,24: active layers, 22,26: active films, 30,32,34, 64: element substrates, 36,38: first element substrates, 40: working liquid, 50: laminated body, 52: support film, 60,62: second element substrates, 100: transistor of first embodiment, 105: transistor of second embodiment, 110: transistor of third embodiment, 115: transistor of fourth embodiment, 120: transistor of fifth embodiment, 125: transistor of sixth embodiment, 500: 4-(trifluoromethyl)thiophenol layer.

BEST MODE FOR CARRYING OUT THE INVENTION

Preferred embodiments of the invention will now be explained in detail, with reference to the accompanying drawings. Throughout the explanation of the drawings, corresponding elements will be referred to by like reference numerals and will be explained only once. Also, some of the drawings are exaggerated in size for easier illustration, and the dimensional proportions will not necessarily match those in the explanation.

As an example of an organic semiconductor element, first a preferred embodiment of a transistor and a process for its production will be explained. The transistor used may be any one without restrictions, so long as it is a current-amplifying or switching semiconductor element and comprises an organic semiconductor compound-containing active layer. The transistor has a construction provided with an active layer and another layer adjacent to the active layer, wherein the active layer is formed on the side of the other layer where the active layer is to be formed. As such transistors there may be mentioned bipolar transistors, static induction transistors, field-effect transistors and the like.

The explanation that follows below assumes a transistor comprising a source electrode and drain electrode, an active layer containing an organic semiconductor compound as a current channel between the electrodes, a gate electrode that controls the current flowing through the current channel and an insulating layer disposed between the active layer and gate electrode, and a production process for the same. Examples of, for example, field-effect transistors having such a construction include those with planar, reverse-staggered, staggered and other structures.

First, the structures of transistors according to the first to sixth embodiments will be explained with reference to FIGS. 1 to 6.

FIG. 1 is a schematic cross-sectional view of a transistor according to the first embodiment. The transistor 100 shown in FIG. 1 comprises a substrate 10, a gate electrode 12 formed on the substrate 10, an insulating layer 14 formed on the substrate 10 covering the gate electrode 12, a source electrode 16 and drain electrode 18 formed on the insulating layer 14, and an active layer 20 formed on the insulating layer 14 covering the source electrode 16 and drain electrode 18.

Figure 2:
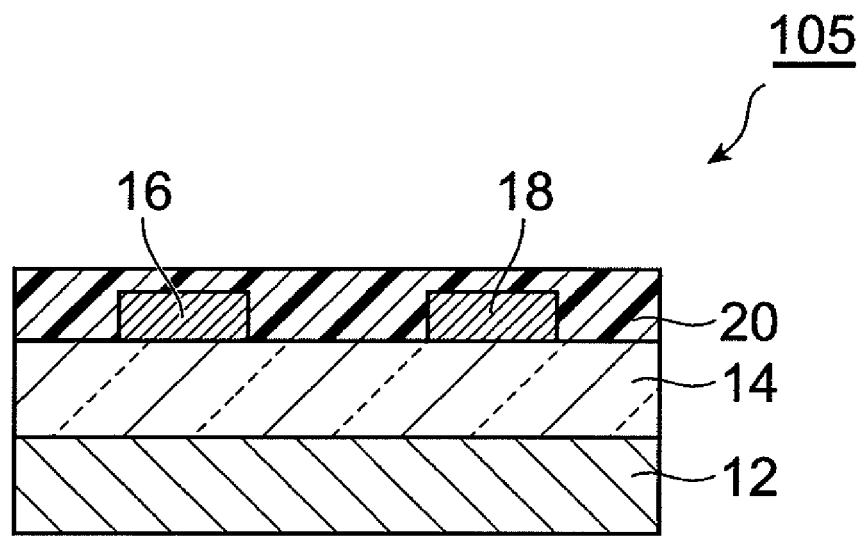
FIG. 2 is a schematic cross-sectional view of a transistor according to a second embodiment.

FIG. 2 is a schematic cross-sectional view of a transistor according to the second embodiment. The transistor 105 shown in FIG. 2 comprises a gate electrode 12, an insulating layer 14 formed on the gate electrode 12, a source electrode 16 and drain electrode 18 formed on the insulating layer 14, and an active layer 20 formed on the insulating layer 14 covering the source electrode 16 and drain electrode 18. The gate electrode 12 of the transistor 105 also provides the function of the substrate 10 in the transistor 100 of the first embodiment.

Figure 3:
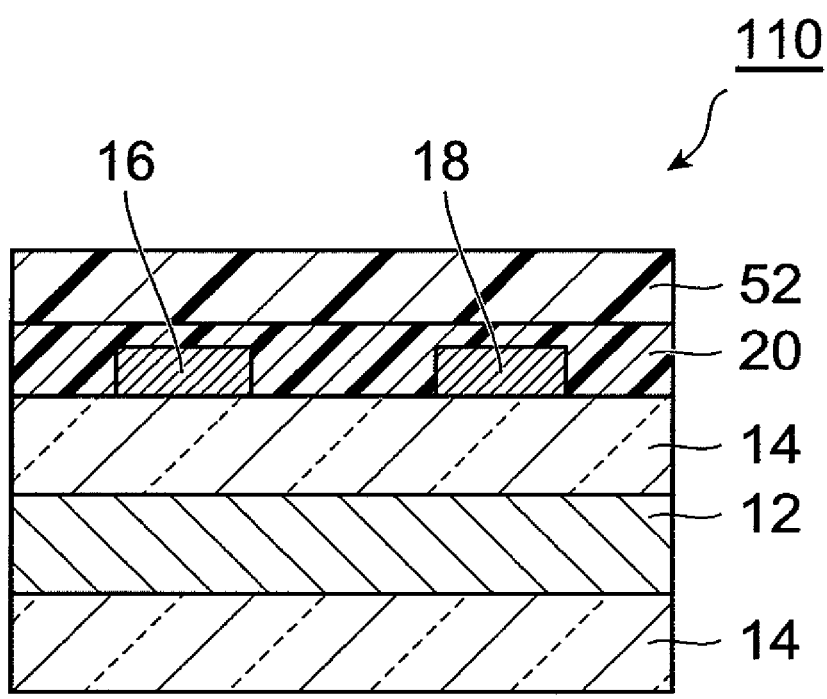
FIG. 3 is a schematic cross-sectional view of a transistor according to a third embodiment.

FIG. 3 is a schematic cross-sectional view of a transistor according to the third embodiment. The transistor 110 shown in FIG. 3 comprises a gate electrode 12, insulating layers 14 formed on both sides of the gate electrode 12, a source electrode 16 and drain electrode 18 formed on one side of the insulating layer 14, an active layer 20 formed on the insulating layer 14 covering the source electrode 16 and drain electrode 18, and a support film 52 formed on the active layer 20. The gate electrode 12 of the transistor 110 also provides the function of the substrate 10 in the transistor 100 of the first embodiment.

Figure 4:
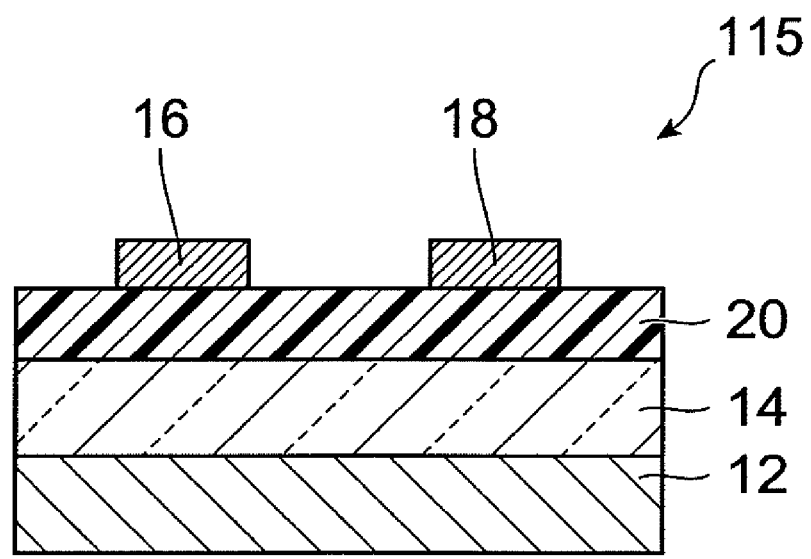
FIG. 4 is a schematic cross-sectional view of a transistor according to a fourth embodiment.

FIG. 4 is a schematic cross-sectional view of a transistor according to the fourth embodiment. The transistor 115 shown in FIG. 4 comprises a gate electrode 12, an insulating layer 14 formed on the gate electrode 12, an active layer 20 formed on the insulating layer 14 and a source electrode 16 and drain electrode 18 formed on the active layer 20.

Figure 5:
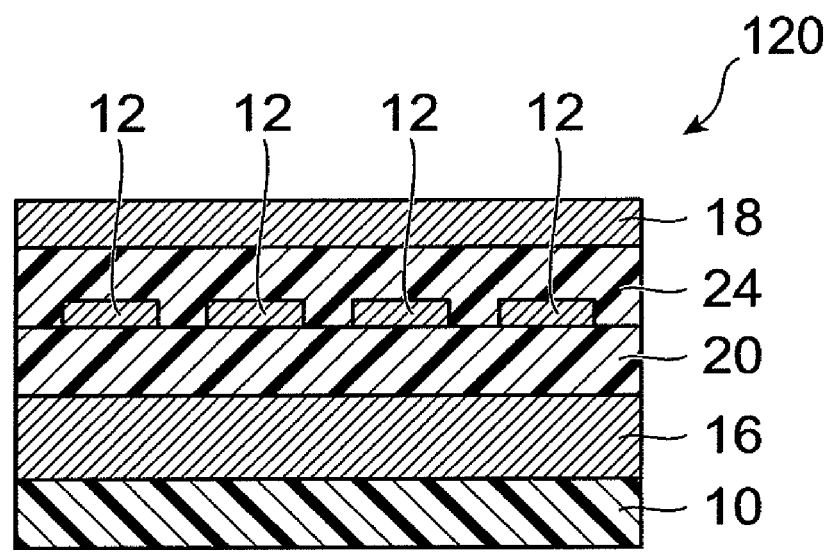
FIG. 5 is a schematic cross-sectional view of a transistor according to a fifth embodiment.

FIG. 5 is a schematic cross-sectional view of a transistor according to the fifth embodiment. The transistor 120 is a static induction organic thin-film transistor. The transistor 120 shown in FIG. 5 comprises a substrate 10, a source electrode 16 formed on the substrate 10, an active layer 20 formed on the source electrode 16, a plurality (four in this case) of gate electrodes 12 formed on the active layer 20, an active layer 24 formed on the active layer 20 covering the gate electrodes 12, and a drain electrode 18 formed on the active layer 24. In this transistor 120, the two active layers 20 and 24 may be layers composed of the same material, or they may be layers composed of different materials.

Figure 6:
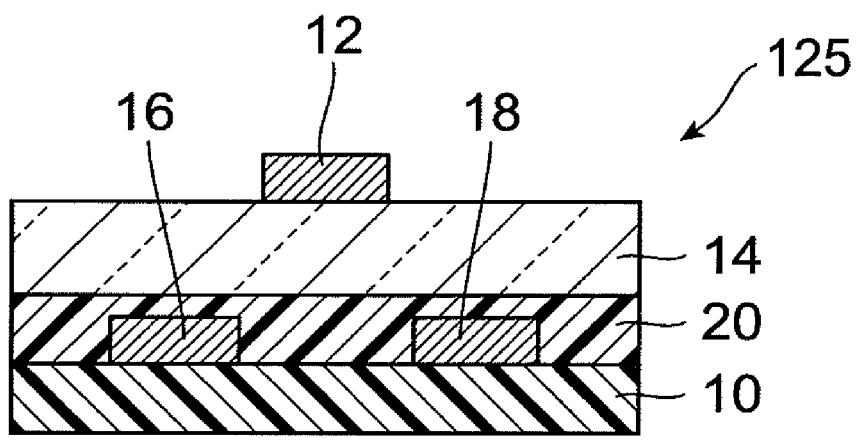
FIG. 6 is a schematic cross-sectional view of a transistor according to a sixth embodiment.

FIG. 6 is a schematic cross-sectional view of a transistor according to the sixth embodiment. This transistor 125 comprises a substrate 10, a source electrode 16 and drain electrode 18 formed on the substrate 10, an active layer 20 formed on the substrate 10 covering the source electrode 16 and drain electrode 18, an insulating layer 14 formed on the active layer 20, and a gate electrode 12 formed on the insulating layer 14.

In the transistor of the first to fourth and sixth embodiments described above, the active layer 20 is a layer containing an organic semiconductor compound, and it serves as a current channel between the source electrode 16 and drain electrode 18. The gate electrode 12 controls the current flowing through the current channel of the active layer 20 by application of voltage.

In the transistor of the fifth embodiment, the active layers 20 and 24 contain organic semiconductor compounds and serve as current channels between the source electrode 16 and drain electrode 18. The gate electrode 12 controls current flowing through the current channel in the same manner described above.

Transistor production processes according to each of the embodiments described above will now be explained, including more detailed explanations of the structures of the transistors.

(Production Process for Transistor of First Embodiment)

Figure 7:
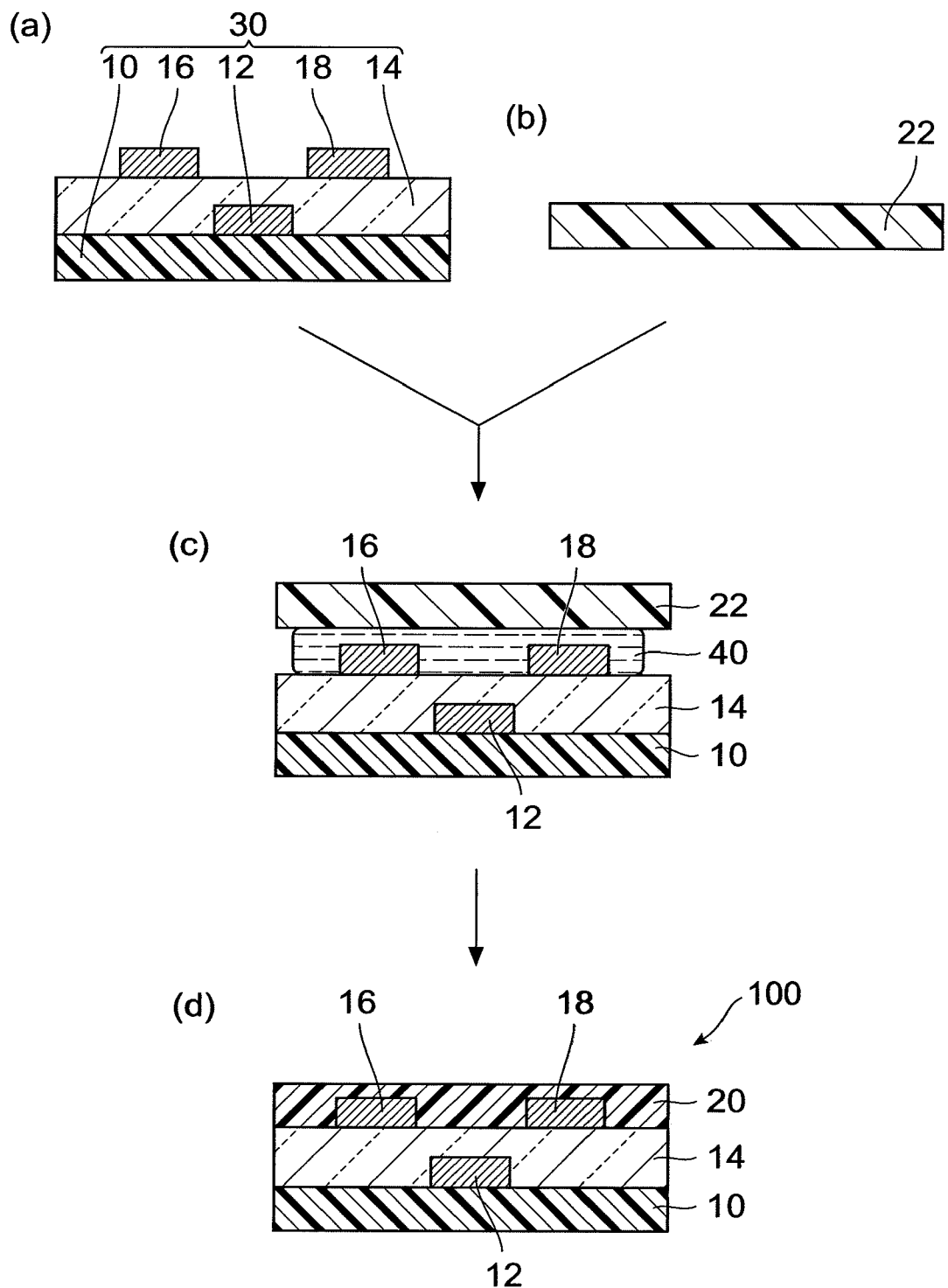
FIG. 7 is a process drawing for a transistor production process according to a first embodiment of the invention.

A transistor production process according to the first embodiment will be explained first. FIG. 7 is a process drawing for a transistor production process according to the first embodiment. In this production process, there is first prepared an element board 30 comprising a substrate 10, a gate electrode 12 formed on the substrate 10, an insulating layer 14 formed on the substrate 10 covering the gate electrode 12 and a source electrode 16 and drain electrode 18 formed on the insulating layer 14 (FIG. 7(a)). Separately there is prepared an active film 22 serving as the organic semiconductor compound-containing active layer 20 (FIG. 7(b)).

The substrate 10 used should not interfere with the properties of the field-effect transistor, and there may be mentioned silicon substrates, glass substrates, plastic substrates, stainless steel foil substrates and the like. The insulating layer 14 is composed of a material with a high electrical insulating property, and for example, silicon oxide, silicon nitride, aluminum oxide, tantalum oxide or an insulating polymer may be used. As insulating polymers there may be mentioned polyimides, poly(vinylphenols), polyesters, methacrylic resins, polycarbonates, polystyrenes, parylene and the like.

The insulating layer 14 may also have the surface physically or chemically modified by any of various methods. As examples of physical modification methods there may be mentioned ozone UV and $O_2$ plasma treatment. As an example of a chemical modification method there may be mentioned treatment with a surface treatment agent such as a silane coupling agent. As surface treatment agents there may be mentioned alkylchlorosilanes, alkylalkoxysilanes, alkylchlorosilane fluorides, alkylalkoxysilane fluorides, and sylylamine compounds such as hexamethyldisilazane. The surface treatment may involve, for example, contacting the insulating layer 14 with a solution or gas containing the surface treatment agent, and the surface treatment agent may be adsorbed onto the surface of the insulating layer 14. Before surface treatment, the surface of the insulating layer 14 to be treated may be pre-treated by ozone UV or $O_2$ plasma.

The method of forming the insulating layer 14 on the substrate 10 may be, for example, a method such as plasma CVD, thermal vapor deposition, thermal oxidation, anodic oxidation, spin coating, casting, microgravure coating, gravure coating, bar coating, roll coating, wire bar coating, dip coating, spray coating, screen printing, flexographic printing, offset printing, ink jet printing or the like.

The gate electrode 12, source electrode 16 and drain electrode 18 are made of conductive materials. Examples of conductive materials include metals such as aluminum, gold, platinum, silver, copper, chromium, nickel or titanium, conductive oxides such as ITO, and conductive polymers including polymer blends of poly(3,4-ethylenedioxythiophene) and polystyrenesulfonic acid. The conductive material may also have metal fine particles, carbon black or graphite microparticles dispersed in a binder.

The element board 30 having the construction described above can be fabricated by a known transistor production process, and for example, the process described in U.S. Pat. No. 6,107,117 may be used.

The active film 22 to serve as the active layer 20 may consist entirely of the organic semiconductor compound, or it may also contain components in addition to the organic semiconductor compound. As organic semiconductor compounds there may be mentioned low molecular organic semiconductor compounds and macromolecular organic semiconductor compounds. As added components there may be mentioned dopants, modulating materials to modulate the carrier in the active layer 20, and macromolecular materials to increase the mechanical properties of the active film. The active film 22 may contain different types of organic semiconductor compounds, and different types of added components. Macromolecular organic semiconductor compounds rather than low molecular organic semiconductor compounds are preferred from the viewpoint of obtaining satisfactory film formability. The active film 22 used to form the active layer 20 may be composed of single crystals of these compounds. An active film 22 composed of single crystals can also be used to easily form the active layer 20 by pasting via the working liquid.

The following compounds may be mentioned as examples of low molecular organic semiconductor compounds and macromolecular organic semiconductor compounds. However, the organic semiconductor compound in the active layer 20 of the transistor of the invention is not limited only to those mentioned below.

As low molecular organic semiconductor compounds there may be mentioned polyacene compounds such as anthracene, tetracene, pentacene, benzopentacene, dibenzopentacene, tetrabenzopentacene, naphthopentacene, hexacene, heptacene and nonacene; coronene compounds such as phenanthrene, pycene, fulminene, pyrene, antanthrene, peropyrene, coronene, benzocoronene, dibenzocoronene, hexabenzocoronene, benzodicoronene and vinylcoronene; perylene compounds such as perylene, terylene, diperylene and quaterrylene; trinaphthene, heptaphene, ovalene, rubicene, violanthrone, isoviolanthrone, chrysene, circumanthracene, bisanthene, zethrene, heptazethrene, pyranthene, violanthene, isoviolanthene, biphenyl, triphenylene, terphenyl, quaterphenyl, circobiphenyl, kekulene, phthalocyanine, porphyrin, fullerenes (C60, C70), tetrathiofulvalene compounds, quinone compounds, tetracyanoquinodimethane compounds, polythiophene oligomers, polypyrrole oligomers, polyphenylene oligomers, polyphenylenevinylene oligomers, polythienylenevinylene oligomers, thiophene-phenylene copolymer oligomers, thiophene-fluorene copolymer oligomers and the like. Derivatives of these low molecular organic semiconductor compounds may also be used. One example of such a compound is rubrene, a benzene-added derivative of tetracene. Other examples include carbon nanotubes which are extended conjugated systems of fullerenes.

As macromolecular organic semiconductor compounds there may be mentioned polythiophene, polyphenylene, polyaniline, polyphenylenevinylene, polythienylenevinylene, polyacetylene, polydiacetylene, polytriphenylamine, triphenylamine-phenylenevinylene copolymers, thiophene-phenylene copolymers, thiophene-fluorene copolymers and the like. Derivatives of these high molecular organic semiconductor compounds may also be used. An example of such a compound is poly(3-hexylthiophene), an alkyl-substituted polythiophene.

The following structures are specific examples of macromolecular organic semiconductor compounds.

[Chemical Formula 1]

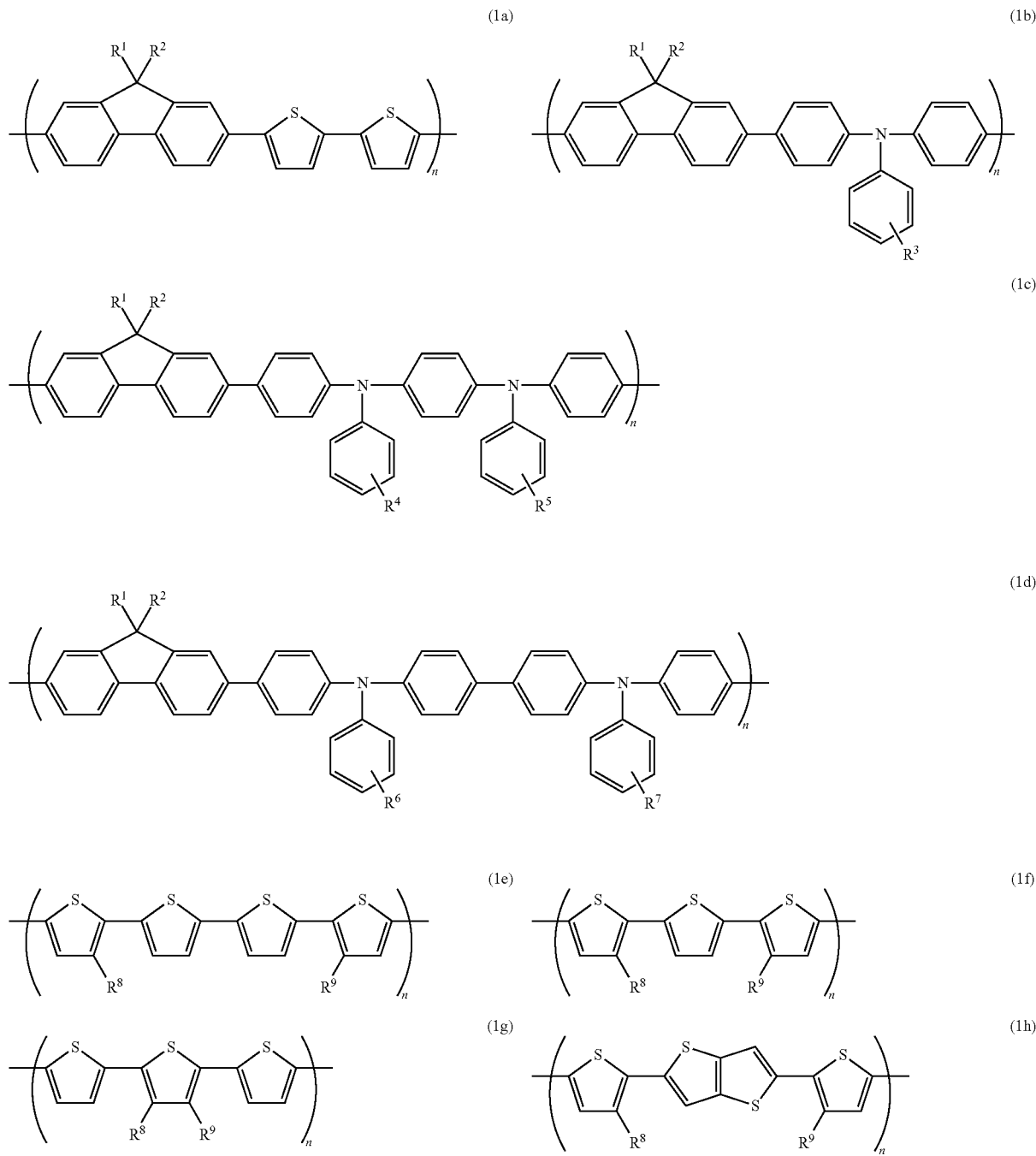

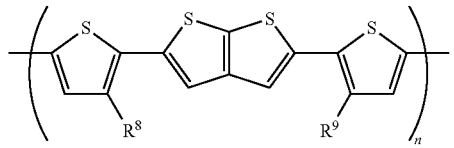

(1i)

In formulas (1a)-(1i), $R^1, R^2, R^3, R^4, R^5, R^6, R^7, R^8$ and $R^9$ each independently represent alkyl, alkoxy, alkylthio, aryl, aryloxy, arylthio, arylalkyl, arylalkoxy, arylalkylthio, arylalkenyl, arylalkynyl, amino, substituted amino, silyl, substituted silyl, silyloxy, substituted silyloxy, monovalent heterocyclic group, a halogen atom or a cyano group, and n is an integer of 1 or greater.

As dopants which may be added in addition to the organic semiconductor compound there may be mentioned acceptor dopants and donor dopants.

First, examples of acceptor dopants include halogens such as iodine, bromine, chlorine, iodine chloride and iodine bromide, sulfur oxide compounds such as sulfuric acid, sulfuric anhydride, sulfur dioxide and sulfates; nitrogen oxide compounds such as nitric acid, nitrogen dioxide and nitrates; halogenated compounds such as perchloric acid and hypochlorous acid, acids such as tetrafluoroboric acid, tetrafluoroboric acid salt, phosphoric acid, phosphoric acid salt and trifluoroacetic acid and their salts; and tetracyanoquinodimethane, tetrachlorotetracyanoquinodimethane, tetrafluorotetracyanoquinodimethane, tetracyanoethylene, dichlorocyanoethylene, dichlorodicyanoquinone, tetrachloroquinone, carbon dioxide, oxygen and the like.

Examples of donor dopants include tetrathiafulvalene, tetramethyltetrathiafulvalene and tetraselenathiafulvalene; amine compounds such as diphenylphenylenediamine, tetraphenylphenylenediamine, tetraphenyldiaminodiphenyl and polyvinylcarbazole; alkali metals, alkaline earth metals, rare earth metals, and complexes of such metals with organic compounds.

As modulating materials for modulation of the carrier in the active layer 20 there may be mentioned conductive materials, including transition metals such as aluminum, iron, copper, nickel, zinc, silver, platinum and gold, and fine particles of the same.

As macromolecular materials to increase the mechanical properties of the active film 22 there may be mentioned polycarbonates, polyacrylates, polymethyl acrylate, polymethyl methacrylate, polystyrene, polyvinyl chloride, polysiloxanes and the like.

For production of an active film 22 as described above, first the organic semiconductor compound or the organic semiconductor compound and other added components are dissolved and dispersed in an organic solvent to prepare a solution. The solution is then coated onto, for example, a polytetrafluoroethylene resin board and the organic solvent is volatilized off. An active film 22 is obtained by this procedure. The active film 22 is preferably released from the polytetrafluoroethylene resin board when the active film 22 is used.

As organic solvents in the solution for production of the active film 22 there may be mentioned chlorine-based solvents such as chloroform, methylene chloride, dichloroethane and trichlorobenzene; ether-based solvents such as tetrahydrofuran; aromatic hydrocarbon-based solvents such as toluene, xylene, mesitylene, tetralin, decalin and n-butylbenzene; and alkoxy group-containing aromatic solvents such as anisole.

Examples of solution coating methods include spin coating, casting, microgravure coating, gravure coating, bar coating, roll coating, wire bar coating, dip coating, spray coating, screen printing, flexographic printing, offset printing, ink jet printing and the like.

In a transistor with an organic semiconductor compound-containing active layer 20, the organic semiconductor compound molecules of the active layer 20 will be aligned in one direction if it is oriented, thus tending to enhance the characteristic (carrier mobility) of the transistor. It is therefore preferred for the active layer 20 to be subjected to orientation treatment.

Such an oriented active layer 20 is preferably obtained by orienting at the active film 22 stage. One orienting method that may be mentioned is stretching of the active film 22. Examples of stretching methods include uniaxial stretching, biaxial stretching, liquid imbibition stretching and roll stretching.

Uniaxial stretching is a method in which a pair of opposing sides of a rectangular active film 22 are gripped with a chuck and pulled in opposite directions. The pulling may be at room temperature, or with appropriate heating. The pulling may also be carried out in a specific gas atmosphere such as nitrogen gas.

Biaxial stretching is a method in which both pairs of opposing sides of a rectangular active film 22 are gripped with a chuck and the film is pulled in the two directions either simultaneously or successively. The pulling may be at room temperature, or with appropriate heating. The pulling may also be carried out in a specific gas atmosphere such as nitrogen gas.

Liquid imbibition stretching is a method in which the active film 22 is immersed in a suitable solution in which the active film 22 swells without dissolving, and the film is pulled by uniaxial stretching or biaxial stretching as described above while in the solution. This manner of pulling may also be carried out at room temperature, or with appropriate heating.

After preparing the element board 30 and active film 22 as explained above for the production process of the first embodiment, the pasting step is carried out, wherein the working liquid 40 is situated between the active film 22 and the insulating layer 14 of the element board 30, and they are attached (FIG. 7(c)). The active film 22 is pasted onto the side of the insulating layer 14 on which the active layer 20 is to be formed.

The working liquid 40 used for the pasting step is a liquid substance having properties allowing it to wet both the insulating layer 14 and active film 22. The working liquid 40 is more preferably one whose contact angle with the side of the insulating layer 14 on which the active layer 20 is to be formed is no greater than 120 degrees, more preferably no greater than 90 degrees and even more preferably no greater than 60 degrees. When a droplet of the working liquid 40 is formed on the insulating layer 14 in air, the "contact angle" is the angle that includes the working liquid 40, among angles measured between the surface of the insulating layer 14 and the tangent drawn to the working liquid 40 from the contact point of the three-phases.

The working liquid 40 is preferably selected as appropriate for the type of insulating layer 14 (based on its contact angle with the insulating layer 14). For example, when the surface of the insulating layer 14 is a silicon oxide ($SiO_2$ or the like), alkyltrichlorosilane (e.g. octadecyltrichlorosilane)-modified silicon oxide, silicon nitride or organic insulating film, the working liquid 40 is preferably a C1-8 alcohol-based solvent such as methanol, ethanol or isopropanol, a ketone-based solvent such as acetone, an ether-based solvent such as diethyl ether, a halogen-based solvent such as chloroform (preferably combined with an alcohol or the like), an aromatic hydrocarbon-based solvent such as toluene (preferably combined with an alcohol or the like), an aliphatic hydrocarbon-based solvent such as hexane, heptane or octane, water (preferably containing a surfactant), a nitrile-based solvent such as acetonitrile, an ester-based solvent such as ethyl acetate, or a solvent containing an amine-based compound such as ammonia water.

The working liquid 40 may also contain added substances such as surfactants to adjust the wettability with the insulating layer 14, dopants that can adjust the transistor characteristics of the active layer 20, or materials for adjustment of the carrier concentration in the active layer 20. The aforementioned solvents mentioned as examples for the working liquid 40 may be used alone or in mixtures of two or more.

An example of a method of situating the working liquid 40 between the active film 22 and insulating layer 14 and attaching them is a method in which the working liquid 40 is coated onto the surface of either the active film 22 or the insulating layer 14 and the other surface is the laminated over the working liquid 40. According to a different method, a prescribed gap is maintained between the active film 22 and insulating layer 14 and the working liquid 40 is injected into the gap. If the contact angle of the working liquid 40 with the insulating layer 14 is less than 120 degrees in these methods as explained above, it will be possible to efficiently wet the surface of the insulating layer 14, thus allowing more satisfactory attachment to be accomplished.

During attachment via the working liquid 40, care should be taken that all of the active film 22 does not elute into the working liquid 40. If all of the active film 22 elutes it will be difficult to form a homogeneous active layer 20. Elution of the active film 22 is preferably prevented by using a working liquid 40 with a solubility parameter (SP value) different from the solubility parameter of the active film 22. A portion of the active film 22 may be dissolved during the attachment, as it is only essential that the entirety not be dissolved.

Heating and/or pressing may also be carried out during the pasting step. This can enhance the adhesiveness between the active film 22 and insulating layer 14 while accelerating removal of the volatilizing components in the removal step described hereunder. Either or both heating and pressing may be carried out. When both are carried out, the heating and pressing may be performed simultaneously or one after the other. In addition to heating and/or pressing, the pasting step may also be carried out under reduced pressure for further enhanced adhesiveness and further accelerated removal of the working liquid. Because undesirable alterations in characteristics may occur in air depending on the type of organic semiconductor compound, the pasting step may be carried out, if necessary, not only under reduced pressure but alternatively in an inert atmosphere such as nitrogen, under light-shaded conditions, or under conditions with controlled moisture, oxygen or the like.

If the heating or pressing is carried out under excessive conditions in the pasting step, however, the characteristics (such as orientation) of the active film 22 may be altered and it may be difficult to obtain an active layer 20 with the desired characteristics. The heating and pressing are therefore preferably carried out under moderate conditions. Suitable heating conditions are, for example, temperature conditions of above room temperature but low enough to avoid deformation of the attached insulating layer 14 or the element board 30 on which it is formed. For example, when the active film 22 is composed of a macromolecular organic semiconductor compound, a temperature of no higher than the liquid crystal phase or isotropic transition temperature is preferred. However, heating may also be performed at a higher temperature for a short period that does not cause the aforementioned problems.

Pressing is carried out in the direction of lamination of the active film 22 and insulating layer 14, and for example, a load may be applied on the active film 22 or a roll may be used to press both the active film 22 and element board 30. The pressure applied is preferably at a level that does not produce deformation or defects in the active film 22 or in the insulating layer 14, substrate 10, source electrode 16 or drain electrode 18 of the element board 30.

If necessary, the pasting step completed in the manner described above may be followed by a removal step for removal of the unnecessary volatilizing components in the working liquid 40. Removing the unnecessary volatilizing components in the working liquid 40 by the removal step yields a transistor 100 according to the first embodiment (FIG. 7(d)). In the removal step, the working liquid 40 may be entirely removed or may partially remain. For example, all of the working liquid 40 may be removed so long as satisfactory adhesion is maintained between the insulating layer 14 and active layer 20.

The thickness of the active layer 20 in the transistor 100 is preferably at least 10 nm, more preferably at least 40 nm and even more preferably at least 200 nm. If the thickness of the active layer 20 is at least 10 nm it will be possible to obtain satisfactory transistor characteristics, and an active layer 20 of even greater thickness will aid in producing a transistor with even higher mobility. Increasing the thickness of the active layer 20 will also tend to prevent problems such as physical damage during fabrication. An active layer 20 with the desired thickness is achieved preferably by suitable adjustment of the thickness at the active film 22 stage. The preferred thickness for the active layer is the same for the second and third embodiments of transistors described hereunder.

(Production Process for Transistor of Second Embodiment)

A preferred process for production of a transistor according to the second embodiment will now be explained.

Figure 8:
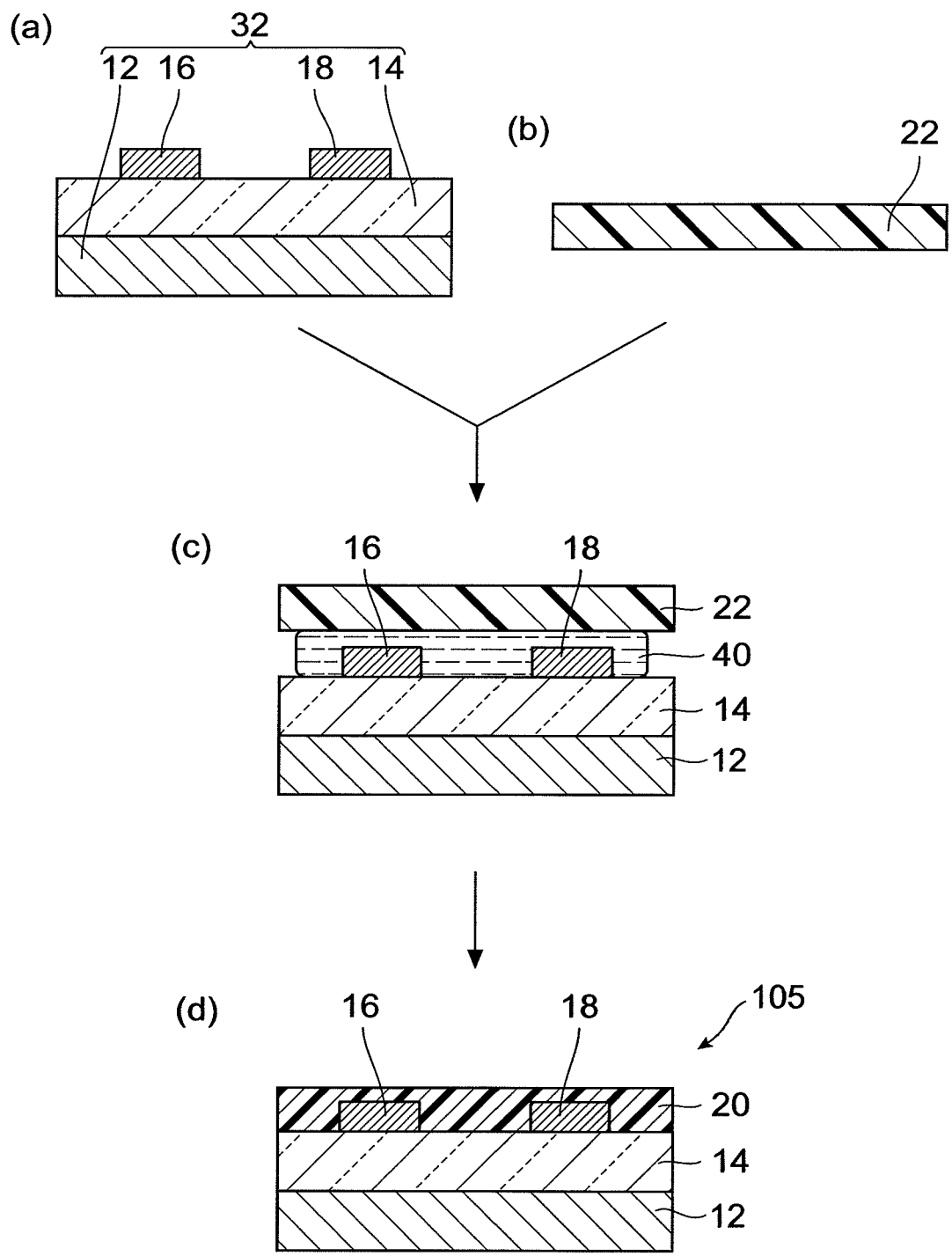
FIG. 8 is a process drawing for a transistor production process according to a second embodiment.

FIG. 8 is a process drawing for a transistor production process according to the second embodiment. In this production process, there is first prepared an element board 32 comprising a gate electrode 12, an insulating layer 14 formed on the gate electrode 12 and a source electrode 16 and drain electrode 18 formed on the insulating layer 14 (FIG. 8(a)). The gate electrode 12 also serves as the substrate in this case. A preferred example of such a gate electrode 12 is a metal base of highly-doped silicon or aluminum. The insulating layer 14 and the source and drain electrodes 16,18 may be formed in the same manner as the first embodiment.

During production of the element board 32 there is also prepared an active film 22 to function as the organic semiconductor compound-containing active layer 20 (FIG. 8(b)). This is followed by a pasting step in which the working liquid 40 is situated between the active film 22 and insulating layer 14, and these are attached (FIG. 8(c)). These steps are carried out in the same manner as for the first embodiment.

After the pasting step, a removal step for removal of the unnecessary volatilizing components in the working liquid 40 is carried out as required, yielding a transistor 105 according to the second embodiment (FIG. 8(d)).

(Production Process for Transistor of Third Embodiment)

A process for production of a transistor according to the third embodiment will now be explained.

Figure 9:
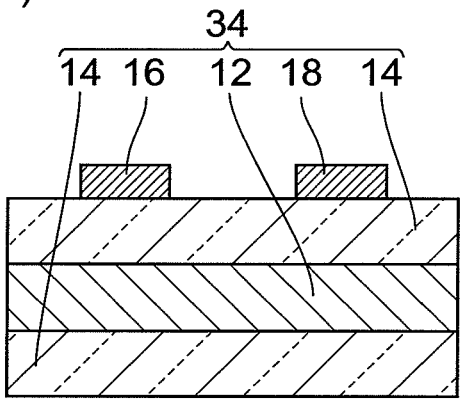
FIG. 9 is a process drawing for a transistor production process according to a third embodiment.
Figure 9:
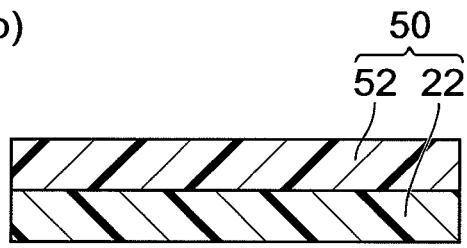
Figure 9:
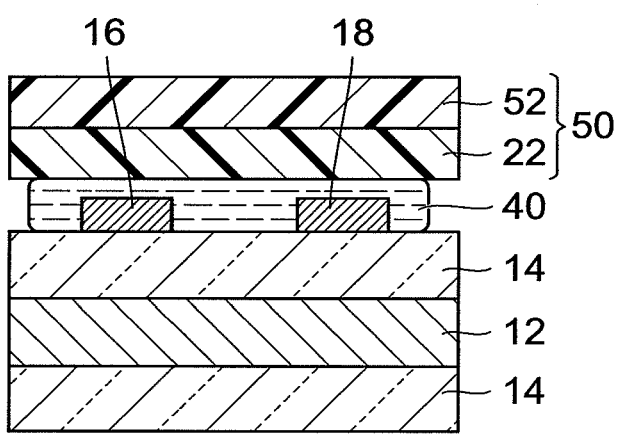
Figure 9:
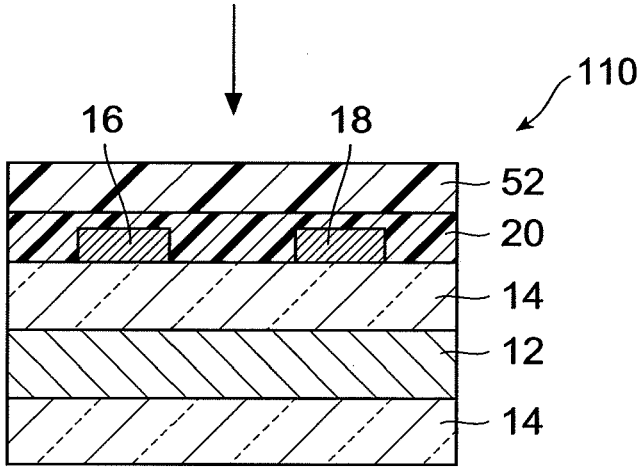

FIG. 9 is a process drawing for a transistor production process according to the third embodiment. In this production process, there is first prepared an element board 34 comprising a gate electrode 12, insulating layers 14 formed on both sides of the gate electrode 12, and a source electrode 16 and drain electrode 18 formed on one of the insulating layers 14 (FIG. 9(a)). Separately there is prepared a laminated body 50 (obtained by laminating the active film 22 on a support film 52), instead of the active film 22 of the first embodiment (FIG. 9(b)). The insulating layer 14 and the source electrode 16 and drain electrode 18 of the element board 34 may be formed in the same manner as for the first embodiment.

The support film 52 of the laminated body 50 may be composed of either an inorganic material or an organic material. Examples of such materials include polysiloxane, fluorine-based resin, polyethylene, polypropylene, methylpentene resin, polycarbonate, polyimide, polyamide, vinyl chloride, vinylidene chloride, acrylic resin, methacrylic resin, polystyrene, nylon, polyester and polyvinyl alcohol materials.

When the active film 22 is oriented before being attached to the insulating layer 14, the method may involve orientation of the active film 22 alone, or orientation after formation of the laminated body 50. In the latter case, the support film 52 is preferably one suitable for orientation by stretching or the like. As examples of such support films 52 there may be mentioned polyethylene, polypropylene, methylpentene resin, polycarbonate, polyimide, polyamide, vinyl chloride, vinylidene chloride, methacrylic resin, nylon, polyester, polyvinyl alcohol and the like.

The support film 52 may be provided with a layer having a function of promoting release from the active film 22 laminated on the support film 52. As examples of such layers there may be mentioned layers with the function of converting light to heat, and layers that swell with heating. Such layers can promote release of the support film 52 and active film 22 by heat. When the support film 52 has such a layer, therefore, it may be exposed to light or heated after the pasting step in which the laminated body 50 and insulating layer 14 are attached, in order to facilitate release of the support film 52 from the active layer 20.

Also, providing the support film 52 with a layer having a function of converting light to heat or a layer that swells with heating may facilitate patterning of the active layer 20. Specifically, after the laminated body 50 has been pasted onto the insulating layer 14, a prescribed section of the active film 22 may be exposed to light through the support film 52 or to heating with a smoothing iron. This will cause the light-exposed or heated sections of the active film to be transferred onto the insulating layer 14 while allowing the other sections to be more easily peeled off with the support film 52. As a result, only the prescribed sections of the active film 22 will remain on the insulating layer 14, thus forming a patterned active layer 20.

The laminated body 50 can be formed, for example, by attachment of the support film 52 and the previously formed active film 22, or by direct addition of the organic semiconductor compound onto the support film 52 or direct coating of the organic semiconductor compound solution onto the support film 52. Direct addition of the organic semiconductor compound to the support film 52 may be accomplished by, for example in the case of a solid organic semiconductor compound, vapor deposition of the organic semiconductor compound, spray coating of its melt or sublimation onto the support film 52. For a single crystal organic semiconductor compound, methods such as natural bonding or attachment with an adhesive onto the support film 52 may be employed.

Direct coating of a solution of the organic semiconductor compound onto the support film 52 can be accomplished by, for example, spin coating, casting, microgravure coating, gravure coating, bar coating, roll coating, wire bar coating, dip coating, spray coating, screen printing, flexographic printing, offset printing, ink jet printing or the like.

When the active film 22 is oriented prior to pasting onto the insulating layer 14, it may be done so as the laminated body 50. Orientation may be carried out by uniaxial stretching, biaxial stretching, liquid imbibition stretching or the like, as for the first embodiment described above. In this case, the support film 52 will also be stretched along with the active film 22.

When the organic semiconductor compound of the active film 22 has a liquid crystal property, orientation of the active film 22 may by accomplished by another method known for orientation of liquid crystals instead of stretching. As examples of such methods there may be mentioned the methods described in Chapter 5 of "Ekisho no Kiso to Oyo" ["Liquid Crystal Fundamentals and Applications" (Matsumoto, S., Kakuta, I., 1991, Kogyo Chosakai Publishing), Chapter 7 of "Kyoindenseiekisho no Kozo to Bussei" ["Structures and Properties of Ferroelectric Liquid Crystals"] (Fukuda, A., Takezoe, H., 1990, Corona Publishing), and "Liquid Crystals", Vol.3, No. 1 (1999) p. 3-16.

Particularly convenient and useful orienting methods include rubbing, photoorientation, shearing (shear stress application) and pull-up coating methods.

Rubbing involves light abrasion of the support film 52 with a cloth or the like. The cloth used for abrasion of the support film 52 may be one made of gauze, polyester, cotton, nylon, rayon or the like. The cloth used for rubbing may be selected as appropriate for the film to be oriented. In this case, formation of a separate oriented film on the support film 52 can further increase the oriented performance. As such oriented films there may be mentioned polyimide, polyamide, polyvinyl alcohol, polyester and nylon films, and commercial liquid crystal oriented films may also be used. The oriented film can be formed by spin coating, flexographic printing or the like.

A photoorientation method is a method in which an orientation film is formed on the support film 52 and exposed to polarized UV light or oblique incident UV light to create an oriented function. As such oriented films there may be mentioned polyimide, polyamide and polyvinyl cinnamate films, and commercial liquid crystal oriented films may also be used.

Such rubbing or photoorientation methods allow orientation of the organic semiconductor compound (active film 22) laminated on the support film 52 that has been treated as described above. Orientation occurs as the organic semiconductor compound reaches its liquid crystal phase or isotropic phase temperature on the support film 52. The organic semiconductor compound can also be added to an already oriented support film 52 for orientation of the active film 22 on the support film 52.

When the organic semiconductor compound is coated onto the support film 52, the coating can be carried out by situating the organic semiconductor compound on the support film 52, setting the temperature to above its Tg or a temperature at which it exhibits a liquid crystal phase or isotropic phase, and coating in one direction using a rod or the like to accomplish orientation. Alternatively, a solution of the organic semiconductor compound in an organic solvent may be prepared and coated by spin coating or flexographic printing. Even if the organic semiconductor compound does not have a liquid crystal property, so long as it can be vapor deposited, it may be epitaxially vapor deposited on an oriented support film 52 to obtain a layer comprising the oriented organic semiconductor compound (active film 22).

Shearing is a method in which a separate substrate is placed over the organic semiconductor compound on the support film 52, and the upper substrate is shifted in one direction at a temperature below the liquid crystal phase or isotropic phase temperature of the organic semiconductor compound. If the support film 52 is a support layer that has been oriented by rubbing or photoorientation as mentioned above, an active film 22 with an even higher degree of orientation can be obtained. The upper substrate may be glass or a polymer film, or even a metal rod.

Pull-up coating is a method in which the support film 52 is immersed in a solution of an organic semiconductor compound and raised to form an oriented organic semiconductor compound layer (active film 22) on the support film 52. There are no particular restrictions on the organic solvent used for the organic semiconductor compound solution or the conditions such as the speed at which the support film 52 is raised, but these are preferably selected and adjusted according to the desired degree of orientation of the organic semiconductor compound.

While several methods for orienting the active film 22 were described above, stretching is the preferred method of orienting for all of the first to sixth embodiments, from the viewpoint of convenience and utility.

After preparing the element board 34 and laminated body 50, the pasting step is carried out, wherein the working liquid 40 is situated between the laminated body 50 and the insulating layer 14 of the element board 34, for attachment of the active film 22 and insulating layer 14 (FIG. 9(c)).

The pasting step may be carried out in the same manner as for the first embodiment, except that the laminated body 50 is positioned with the active film 22 facing the insulating layer 14, and the working liquid 40 is situated between the laminated body 50 and insulating layer 14. Heating and/or pressing may also be carried out in the pasting step as for the first embodiment, and reduced pressure conditions may also be employed.

In the production process for a transistor according to the third embodiment as well, the pasting step may be followed by a removal step for removal of the unnecessary volatilizing components in the working liquid 40, as required. This can yield a transistor 110 according to the third embodiment with the support film 52 laminated on the active layer 20 (FIG. 9(d)). Upon completing the transistor 110, the support film 52 may be removed or may be left if it does not interfere with practical use. When the support film 52 is left, the support film 52 is preferably one that also serves a function of protection from factors that can impair the characteristics of the active layer 20 (such as physical damage, effects of gas such as air, static electricity, etc.).

(Production Process for Transistor of Fourth Embodiment)

A process for production of a transistor according to the fourth embodiment will now be explained.

Figure 10:
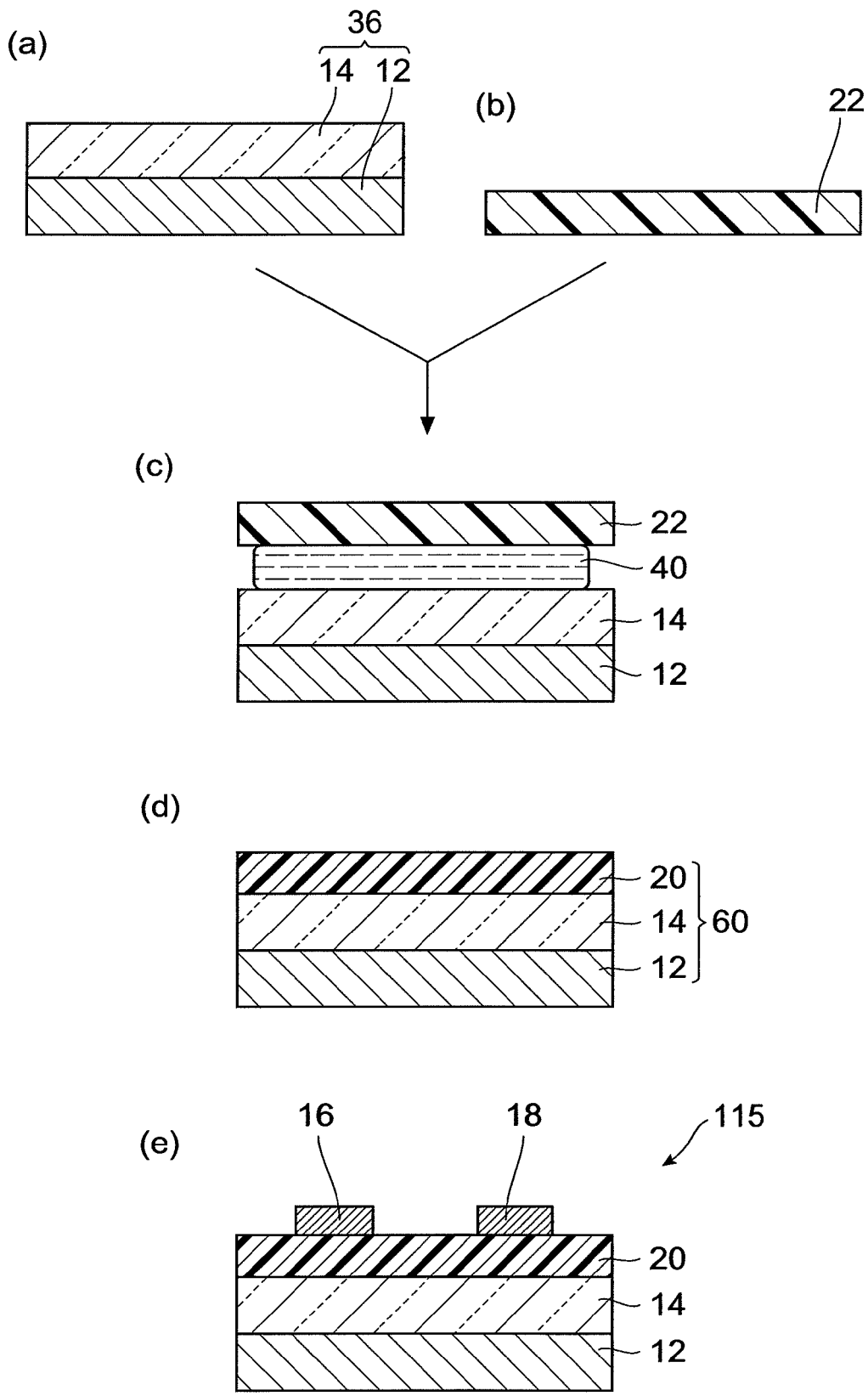
FIG. 10 is a process drawing for a transistor production process according to a fourth embodiment.

FIG. 10 is a process drawing for a transistor production process according to the fourth embodiment. In this production process, there is first prepared a first element board 36 comprising a gate electrode 12 and an insulating layer 14 formed thereon (FIG. 10(a)). The gate electrode 12 also serves as the substrate. The construction and production process for the gate electrode 12 and insulating layer 14 may be the same as for the second embodiment.

During production of the first element board 36 there is also prepared an active film 22 to function as the organic semiconductor compound-containing active layer 20 (FIG. 10(b)). This is followed by a pasting step in which the working liquid 40 is situated between the active film 22 and the insulating layer 14 of the first element board 36, and these are attached (FIG. 10(c)). The pasting step may also be carried out in the same manner as for the first embodiment. In the pasting step, a laminated body 50 according to the third embodiment may be used instead of the active film 22. In this case, the pasting is followed by the procedure described below for removal of the support film 52 of the laminated body 50.

A subsequent removal step for removal of the unnecessary volatilizing components in the working liquid 40 is carried out as required, to form a second element board 60 having the active layer 20 on the element board 36 (FIG. 10(d)). A source electrode 16 and drain electrode 18 are formed on the active layer 20 of the second element board 60 in the same manner as the first embodiment, to obtain a transistor 115 according to the fourth embodiment (FIG. 10(e)).

(Production Process for Transistor of Fifth Embodiment)

A preferred process for production of a transistor according to the fifth embodiment will now be explained.

Figure 11:
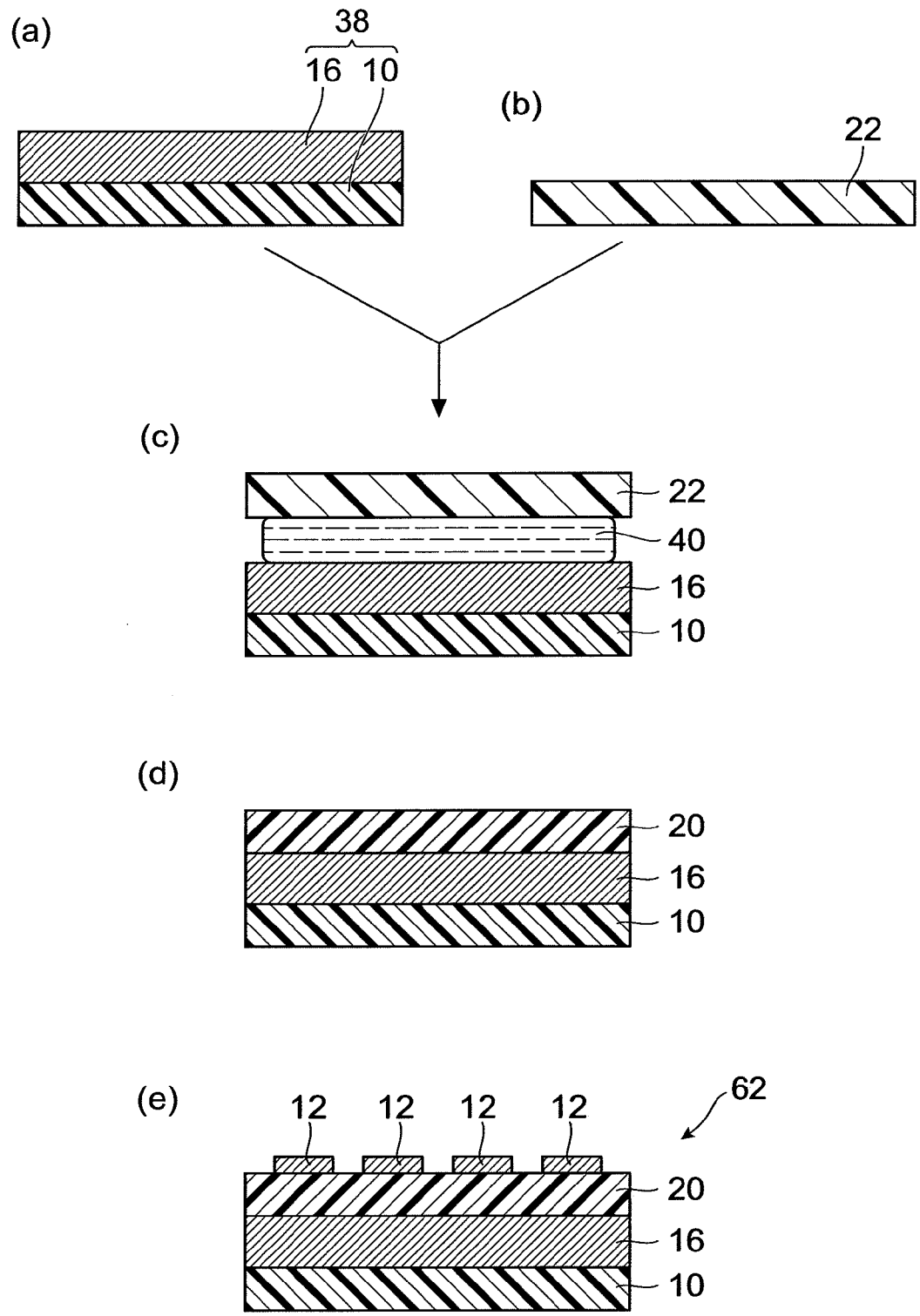
FIG. 11 is a process drawing for a transistor production process according to a fifth embodiment.
Figure 12:
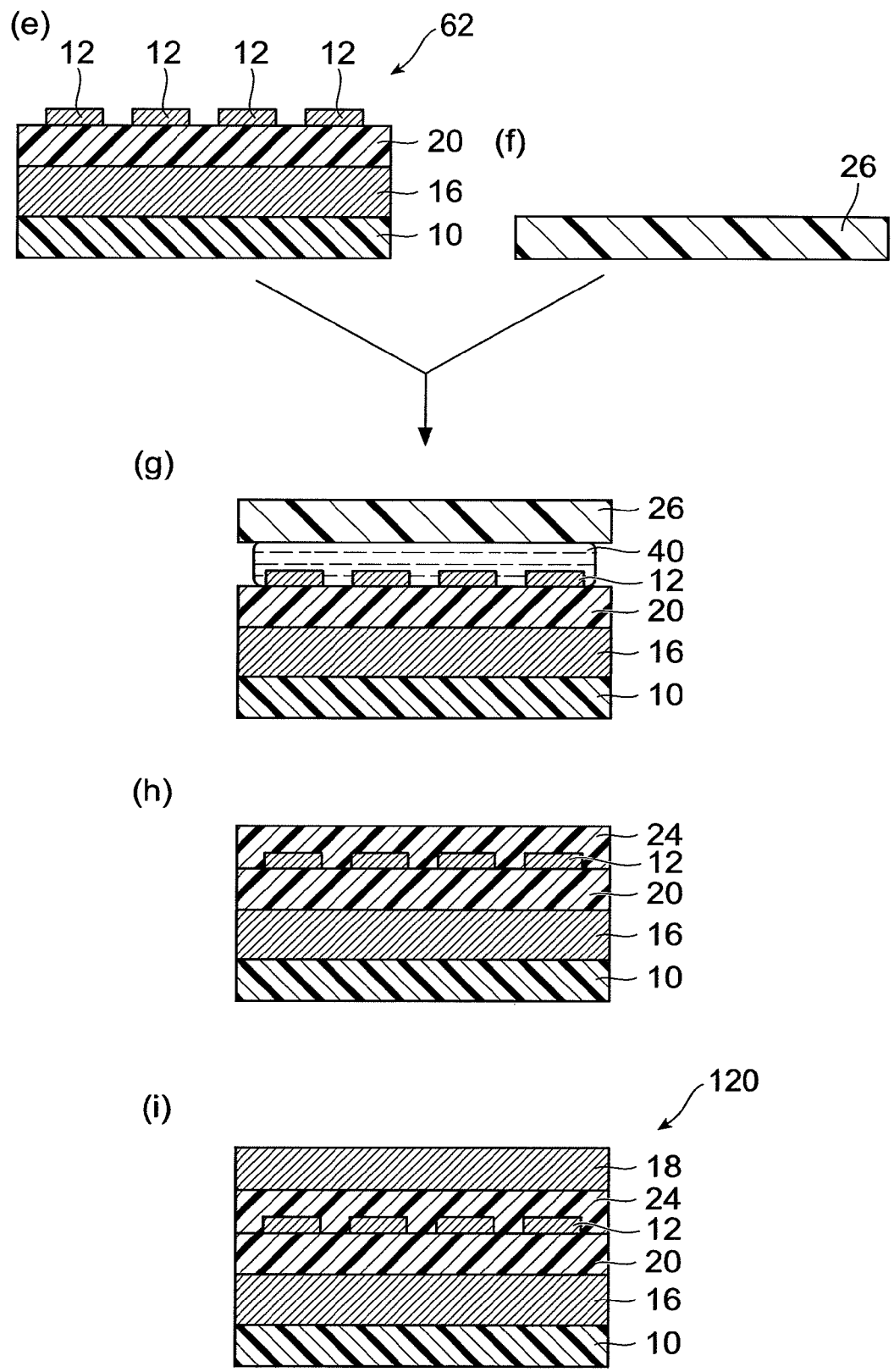
FIG. 12 is a process drawing for a transistor production process according to a fifth embodiment.

FIGS. 11 and 12 are process drawings for a transistor production process according to the fifth embodiment. In this production process there is first prepared a first element board 38 comprising a substrate 10 and a source electrode 16 formed thereon (FIG. 11(a)).

Separately there is prepared an active film 22 serving as the organic semiconductor compound-containing active layer 20 (FIG. 11(b)). This is followed by a first pasting step in which the working liquid 40 is situated between the active film 22 and the source electrode 16 of the first element board 38, and these are attached (FIG. 11(c)). The first pasting step may be carried out in the same manner as for the first embodiment.

A first removal step for removal of the unnecessary volatilizing components in the working liquid 40 is then carried out as required, to form an active layer 20 on the first element board 38 (FIG. 11(d)). Next, a plurality of gate electrodes 12 (four in this case) are formed on the active layer 20 to obtain a second element board 62 (FIG. 11(e)). The gate electrodes 12 used may be the same as for the first embodiment.

During production of the second element board 62 (FIG. 12(e)) there is separately prepared an active film 26 which is to serve as the organic semiconductor compound-containing active layer 24 (FIG. 12(f)). The organic semiconductor compound in the active film 26 may be the same as or different from that in the active layer 20. This step is followed by a second pasting step in which the working liquid 40 is situated between the active film 26 and the active layer 20 of the second element board 62, and these are attached (FIG. 12(g)). The active film 26 is thus pasted on the active layer 20 so as to cover the gate electrode 12. The second pasting step may also be carried out in the same manner as for the first embodiment. The working liquid 40 used in the second pasting step may be the same as or different from that used in the first pasting step.

This is followed by a second removal step for removal of the unnecessary volatilizing components in the working liquid 40, as required, to bond the active film 26 to the active layer 20 while sandwiching the gate electrode 12, to form an active layer 24 (FIG. 12(h)). A drain electrode 18 is formed on the obtained active layer 24 in the same manner as the first embodiment, to obtain a transistor 120 according to the fifth embodiment. In the process for production of a transistor according to the fifth embodiment, either or both the active layer 20 and 24 may be formed by the process described in Japanese Unexamined Patent Publication No. 2004-006476, for example. In the first and second pasting steps, a laminated body 50 according to the third embodiment may be used instead of the active film 22. In this case, the procedure following pasting is carried out after removing the support film 52 of the laminated body 50.

(Production Process for Transistor of Sixth Embodiment)

A preferred process for production of a transistor according to the sixth embodiment will now be explained.

Figure 13:
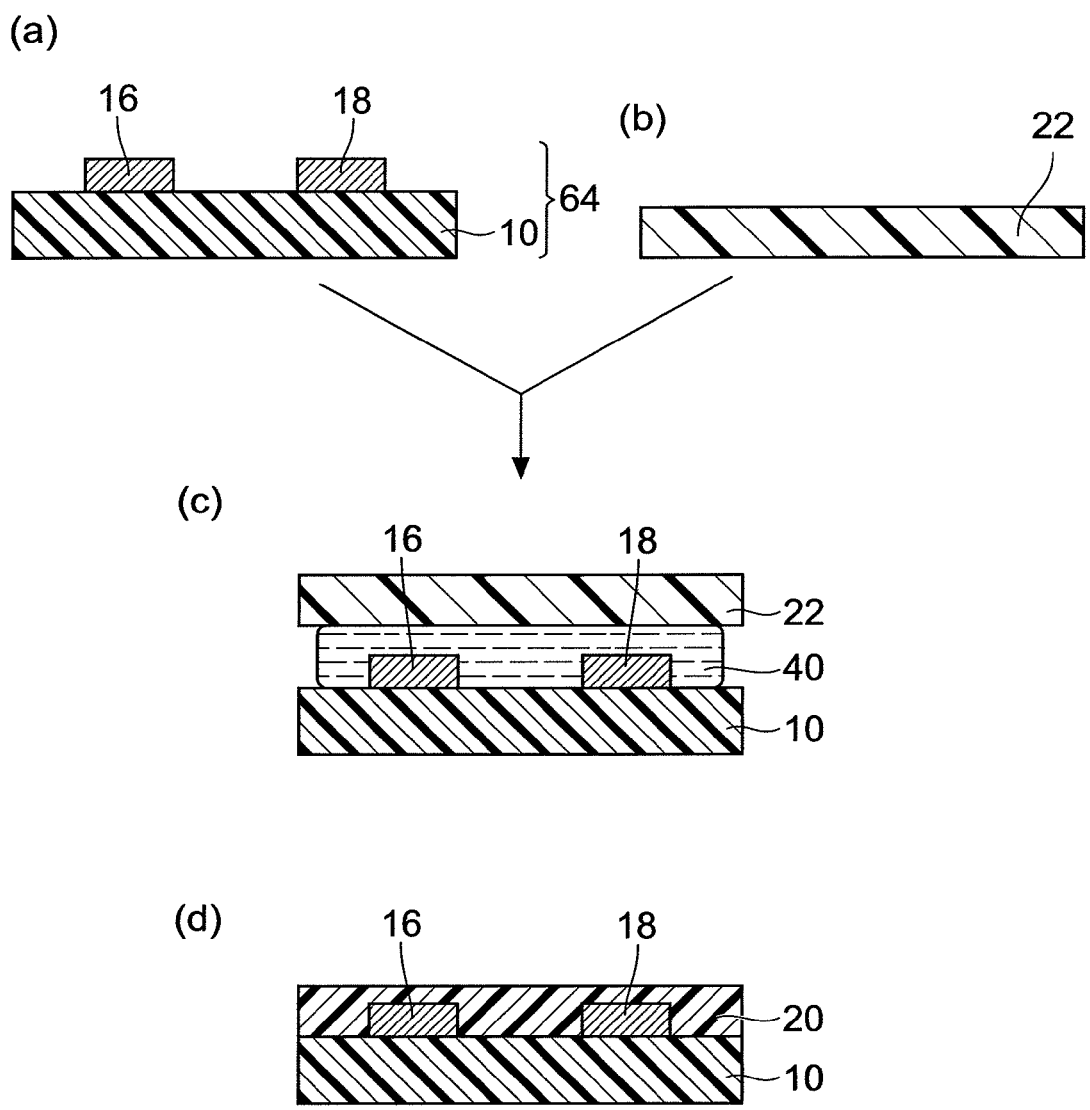
FIG. 13 is a process drawing for a transistor production process according to a sixth embodiment.
Figure 14:
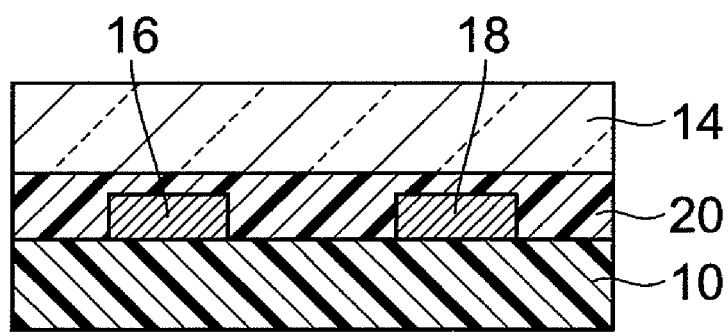
FIG. 14 is a process drawing for a transistor production process according to a sixth embodiment.
Figure 14:
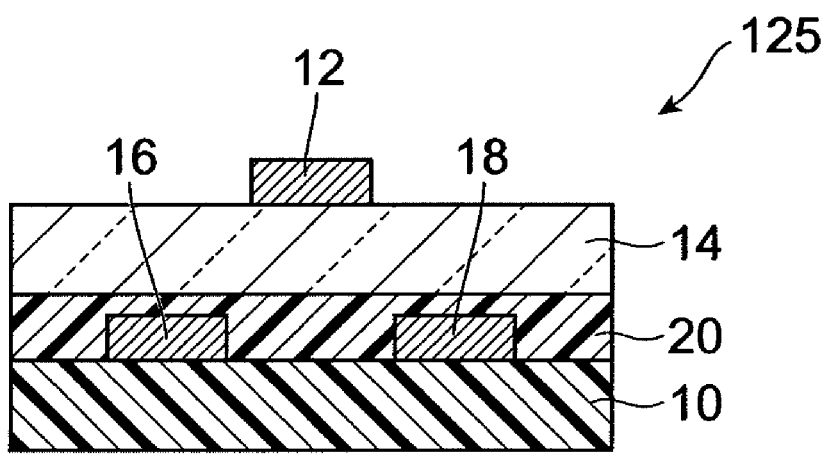

FIGS. 13 and 14 are process drawings for a transistor production process according to the sixth embodiment. In this production process, there is first prepared an element board 64 comprising a substrate 10 and a source electrode 16 and drain electrode 18 formed thereon (FIG. 13(a)). The source electrode 16 and drain electrode 18 may be formed in the same manner as the first embodiment.

During production of the element board 64 there is also prepared an active film 22 to function as the organic semiconductor compound-containing active layer 20 (FIG. 13(b)). This is followed by a pasting step in which the working liquid 40 is situated between the active film 22 and the substrate 10 of the element board 64, and these are attached (FIG. 13(c)). The pasting step may also be carried out in the same manner as for the first embodiment.

A removal step for removal of the unnecessary volatilizing components in the working liquid 40 is then carried out as required, to form an active layer 20 on the element board 64 so as to cover the source electrode 16 and drain electrode 18 (FIG. 13(d)). An insulating layer 14 is then formed on the active layer 20 in the same manner as for the first embodiment (FIG. 14(e)). A gate electrode 12 is formed on the obtained insulating layer 14 in the same manner as for the first embodiment, to obtain a transistor 125 according to the sixth embodiment (FIG. 14(f)).

For production of a transistor according to the sixth embodiment as well, a laminated body 50 according to the third embodiment may be used instead of the active film 22. In this case, the procedure following pasting is carried out after removal of the support film 52 of the laminated body 50. When the support film 52 also has a function as an insulating layer 14, it may be used as the insulating layer 14 and does not need to be removed.

The transistors and production processes according to the first to sixth embodiments were explained above as examples of organic semiconductor elements and their production processes, but a transistor according to the invention is not necessarily limited to the embodiments described above and may incorporate modifications as deemed suitable.

For example, the active layer 20 of the transistor of each embodiment (the active layers 20 and 24 in the case of the fifth embodiment) do not need to be single layers and may instead comprise multiple layers. When the active layers 20,24 are multiple layers, they may be composed of the same material or of different materials. Such active layers 20,24 composed of multiple layers may be formed by further laminating the same or diverse active films on the active films 22,26 used to form the active layers 20,24, if necessary after removing the support film remaining thereover.

Furthermore, all of the embodiments described above have constructions with the source electrode 16 or drain electrode 18 directly bonded to the active layer 20 or 24, but there is no limitation to such a construction and instead, a layer composed of a compound different from the organic semiconductor compound may intervene between the source electrode 16 and/or drain electrode 18 and the active layers 20,24. This can reduce contact resistance between the source electrode 16 and drain electrode 18 and the active layers 20,24, thus further enhancing the carrier mobility of the transistor. As compounds different from organic semiconductor compounds there may be mentioned donor compounds, acceptor compounds and thiol group-containing compounds.

As donor compounds there may be mentioned tetrathiafulvalene, tetramethyltetrathiafulvalene and tetraselenathiafulvalene; amine compounds such as diphenylphenylenediamine, tetraphenylphenylenediamine, tetraphenyldiaminodiphenyl and polyvinylcarbazole; alkali metals, alkaline earth metals, rare earth metals, and complexes of such metals with organic compounds.

As acceptor compounds there may be mentioned halogens such as iodine, bromine, chlorine, iodine chloride and iodine bromide; sulfur oxide compounds such as sulfuric acid, sulfuric anhydride, sulfur dioxide and sulfuric acid salts; nitrogen oxide anhydrides such as nitric acid, nitrogen dioxide and nitric acid salts; halogenated compounds such as perchloric acid and hypochlorous acid; acids such as tetrafluoroboric acid, tetrafluoroboric acid salts, phosphoric acid, phosphoric acid salts, trifluoroacetic acid and their salts; and tetracyanoquinodimethane, tetrachlorotetracyanoquinodimethane, tetrafluorotetracyanoquinodimethane, tetracyanoethylene, dichlorocyanoethylene, dichlorodicyanoquinone, tetrachloroquinone and the like.

As thiol group-containing compounds there may be mentioned alkylthiol compounds such as alkylthiols, and fluorinated alkylthiols; and aromatic thiol compounds such as aromatic thiols, fluorinated alkylaromatic thiols, fluorinated aromatic thiols, nitroaromatic thiols and aminoaromatic thiols.

A layer composed of such a compound may be formed by, for example, contacting the surface of the source electrode 16 or drain electrode 18 with a solution or gas containing the compound to adsorb the compound onto the contact surface.

There are no particular restrictions on the thicknesses of the source electrode 16 and drain electrode 18 in the transistor of each of the aforementioned embodiments. However, when the active layer 20 or 24 is formed on the source electrode 16 or drain electrode 18 as according to the first to third and fifth embodiments, the source electrode 16 and drain electrode 18 are preferably as thin as possible within a functionable range as electrodes, in order to achieve more satisfactory adhesiveness with the active layers 20,24.

The transistors of the first to sixth embodiments may also be sealed transistors, obtained by sealing after completing the element structure described above. This will shield the transistor from air while also protecting it from physical damage, thus helping to avoid loss of the transistor characteristics.

The sealing method may be a method in which the element structure is covered with an insulating polymer, UV curing resin, thermosetting resin or inorganic silicon oxide film or silicon nitride film, or a method in which a glass plate or a film is attached to the element structure using an UV curing resin, thermosetting resin or the like. For effective shielding from air, the steps after fabrication of the transistor and before sealing are preferably carried out without exposure to air (for example, in a dry nitrogen atmosphere or in a vacuum).

The organic semiconductor element of the invention is not limited to a transistor as described above so long as it comprises an organic semiconductor compound-containing active layer and the active layer is attached to the adjacent layers via the working liquid. As examples of organic semiconductor elements other than transistors there may be mentioned diodes, photodiodes, solar cells, light emitting diodes, memory chips, luminescent transistors, sensors and the like.

The organic semiconductor element, which may be a transistor as described above, may be satisfactorily utilized in semiconductor devices. As semiconductor devices there may be mentioned wireless tags, displays, large-area sensors and the like. A logic circuit may be constructed in the semiconductor device using the transistor, for example, either alone or in combination with other transistors. More specifically, the invention is suitable for semiconductor devices such as display pixel switching transistors, signal driver circuit elements, memory circuit elements, signal processing unit elements and the like. Other applications are numerous and include electronic paper, liquid crystal or organic LEDs and other displays.

EXAMPLES

The present invention will now be explained in greater detail based on examples and comparative examples, with the understanding that these examples are in no way limitative on the invention.

<Organic Semiconductor Compound>

Poly(3-hexylthiophene) and poly(3-octylthiophene) were purchased from Aldrich Co. The poly(3-hexylthiophene) and poly(3-octylthiophene) used were regioregular compounds.

Example 1

Figure 15:
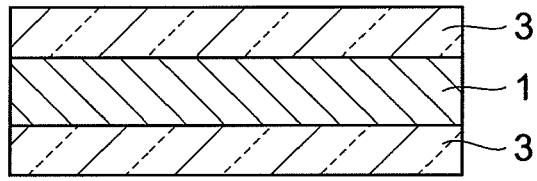
FIG. 15 is a drawing illustrating the production steps for the transistor of Example 1.
Figure 15:
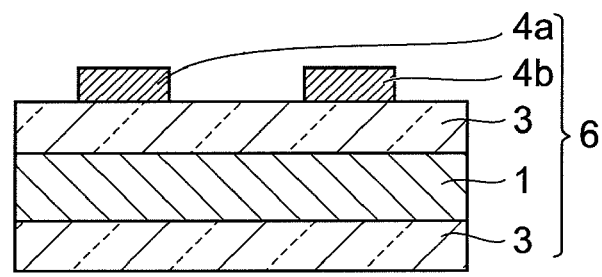
Figure 15:
Figure 15:
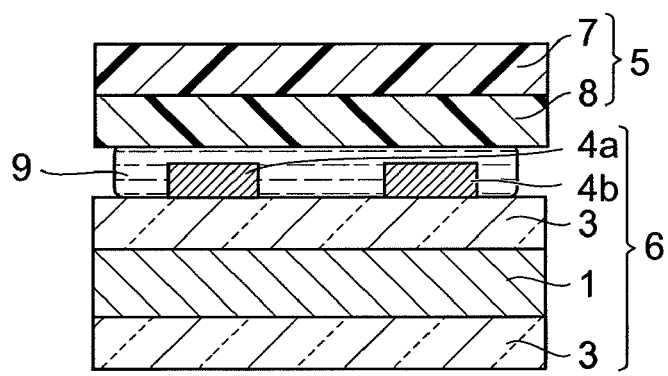
Figure 15:
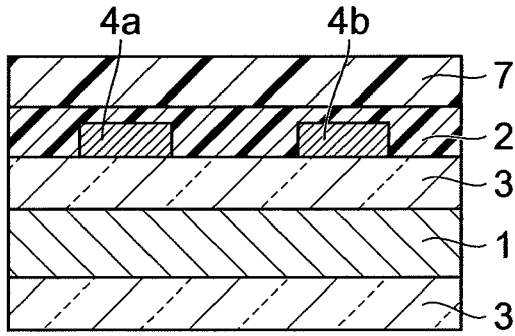

Formation of Transistor by Production Process of Third Embodiment, and Evaluation of Physical Properties A transistor was fabricated by a process based on the production process for a transistor according to the third embodiment. FIG. 15 is a drawing illustrating the production steps for the transistor of Example 1. Specifically, as shown in FIG. 15(a), the surface of a highly doped n-type silicon substrate 1 as the substrate/gate electrode was subjected to thermal oxidation to form 200 nm silicon oxide films as insulating layers 3, for use as a support substrate. Next, as shown in FIG. 15(b), the surface of one of the insulating layers 3 of the substrate was subjected to vapor deposition for deposition of gold to a thickness of 50 nm, to form a source electrode 4a and drain electrode 4b with lead wires and pads. The channel width of the electrodes was 500 μm and the channel length was 20 μm.

Next, using a method described in the literature (S. R. Wasserman, et al., Langmuir, Vol. 5, p 1074, 1989), the surface of the insulating layer 3 was modified by immersion in an octadecyltrichlorosilane octane solution (6 mmol/l) for 24 hours, to form an element board 6.

Separately, a poly(3-hexylthiophene) chloroform solution (0.5 wt %) was prepared in a glove box with a nitrogen atmosphere. The poly(3-hexylthiophene) was weighed in air. The poly(3-hexylthiophene) chloroform solution was then coated by spin coating (1000 rpm) onto the polyethylene film as the support film 7 in a glove box with a nitrogen atmosphere. This formed a laminated body 5 comprising a poly(3-hexylthiophene) film 8 laminated on a polyethylene support film 7, as shown in FIG. 15(c).

Next, in a glove box with a nitrogen atmosphere, a dropper was used to place a drop of methanol as the working liquid 9 on the insulating layer 3 on which the source electrode 4a and drain electrode 4b had been formed, as shown in FIG. 15(d). The laminated body 5 was then set on the insulating layer 3 with the poly(3-hexylthiophene) film 8 facing it and the working liquid 9 between them, and the stack was allowed to stand until the methanol dried off. The contact angle between the working liquid 9 and the insulating layer 3 was 40 degrees.

The drying removal of the methanol resulted in natural bonding of the laminated body 5 with the insulating layer 3, covering the source electrode 4a and drain electrode 4b. Heat treatment was then conducted at 60° C. for 15 minutes in a nitrogen atmosphere for more thorough removal of the methanol. This procedure yielded a transistor comprising an active layer 2 made of poly(3-hexylthiophene) (FIG. 15(e)).

Figure 17:
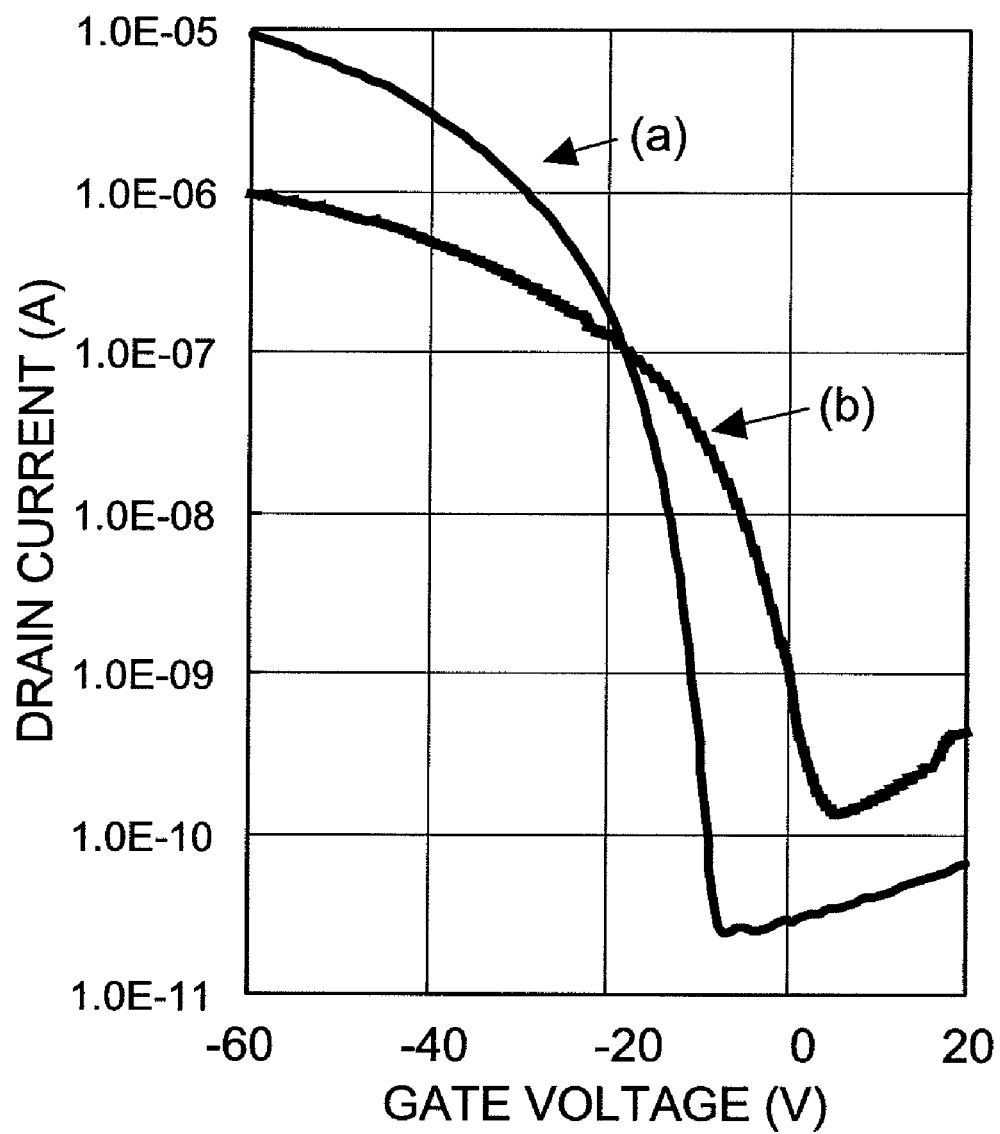
FIG. 17 is a graph showing the I-V characteristics of the transistors used in Example 1 and Comparative Example 2.

To the transistor fabricated in this manner there was applied a gate voltage $V_G$ of 40 to −60 V and a source-drain voltage $V_{SD}$ of −40 V in a nitrogen atmosphere, using a silicon substrate 1 as the gate electrode, and the transistor characteristics were measured. As a result, a satisfactory I-V characteristic was obtained (see curve in FIG. 17 (a)), and a drain current of approximately 9 μA was achieved at $V_G$=−60 V, $V_{SD}$=−40 V. The mobility obtained from the I-V characteristic was $2.3 \times 10^{-2}$ cm$^2$/Vs, and the on/off current ratio was on the level of $10^5$.

Comparative Example 1

Figure 16:
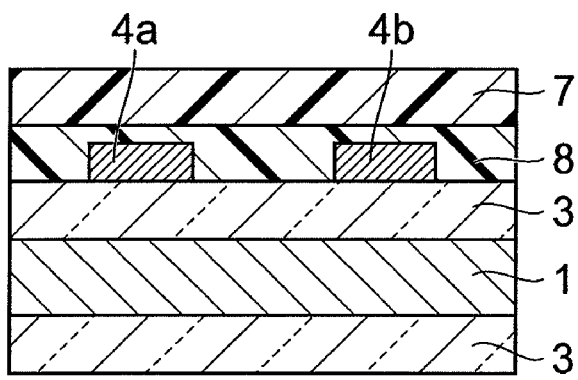
FIG. 16 is a drawing illustrating a portion of the production steps for the transistors of Comparative Example 1 and Comparative Example 2.
Figure 16:
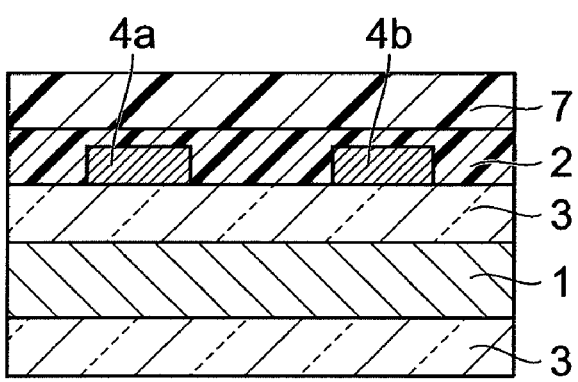
Figure 16:
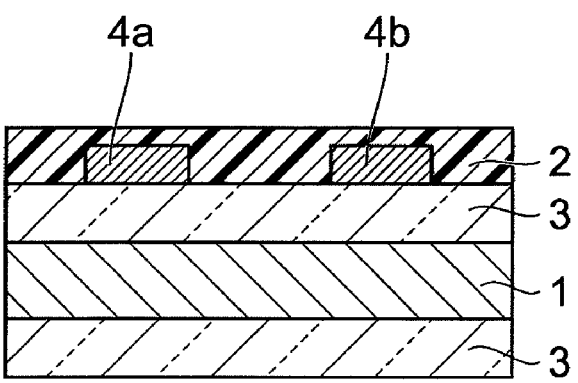

Formation of Transistor without Working Liquid, and Evaluation of Physical Properties The steps of FIG. 15(a)-(c) were followed by the steps shown in FIGS. 16(a) and (b) to fabricate a transistor for Comparative Example 1. Specifically, first an element board 6 was fabricated in the same manner as Example 1 by the production steps illustrated in FIG. 15(a), (b).

A poly(3-hexylthiophene) chloroform solution (0.5 wt %) was also prepared in a glove box with a nitrogen atmosphere. The poly(3-hexylthiophene) was weighed in air.

Next, the poly(3-hexylthiophene) chloroform solution was coated onto a polyethylene film as the support film 7 by spin coating (1000 rpm) in a glove box with a nitrogen atmosphere, to form a laminated body 5 having the poly(3-hexylthiophene) film 8 laminated on the polyethylene support film 7 (FIG. 15(c)).

Tweezers were used to place the laminated body 5 on the insulating layer 3 having the source electrode 4a and drain electrode 4b formed thereon in a glove box with a nitrogen atmosphere, with the poly(3-hexylthiophene) film 8 facing the insulating layer 3 (FIG. 16(a)). This procedure yielded a transistor comprising poly(3-hexylthiophene) as the active layer 2 (FIG. 16(b)). To the transistor obtained in this manner there was applied a gate voltage $V_G$ of 40 to −60 V and a source-drain voltage $V_{SD}$ of −40 V in a nitrogen atmosphere, using a silicon substrate 1 as the gate electrode, and the transistor characteristics were measured; however, the transistor did not operate and the I-V characteristic could not be obtained.

Comparative Example 2

Formation of Transistor with Active Layer Formed by Casting, and Evaluation of Physical Properties An element board 6 was fabricated according to the process described in Example 1. The poly(3-hexylthiophene) was weighed in air, and its chloroform solution (0.1 wt %) was prepared in a glove box with a nitrogen atmosphere.

The poly(3-hexylthiophene) chloroform solution was then coated by casting onto the insulating layer 3 having the source electrode and drain electrode formed thereon in a glove box with a nitrogen atmosphere, to form an active layer 2 made of poly(3-hexylthiophene). It was then subjected to heat treatment at 60° C. for 15 minutes in a nitrogen atmosphere to remove the solvent. A transistor having the construction shown in FIG. 16(c) was thus fabricated.

To the transistor obtained in this manner there was applied a gate voltage $V_G$ of 40 to −60 V and a source-drain voltage $V_{SD}$ of −40 V in a nitrogen atmosphere, using a silicon substrate 1 as the gate electrode, and the transistor characteristics were measured. As a result, a satisfactory I-V characteristic was obtained (see curve in FIG. 17(b)), and a drain current of approximately 1 μA was achieved at $V_G$=−60 V, $V_{SD}$=−40 V. The mobility obtained from the I-V characteristic was 1.5× $10^{-3}$ cm²/Vs, and the on/off current ratio was on the level of $10^3$.

The properties of the transistors fabricated in Example 1 and Comparative Examples 1 and 2 are shown in Table 1. First, the transistor obtained by the process performing attachment without the working liquid (Comparative Example 1) did not operate. The transistor of Example 1 had remarkably higher mobility than that of Comparative Example 2. This demonstrated that the transistor production process of the invention can satisfactorily form an active layer with superior carrier mobility.

TABLE 1

| Transistor | Active layer forming method | Mobility (cm²/Vs) |
| --- | --- | --- |
| Example 1 | Active layer, attachment, working liquid | $2.3 \times 10^{-2}$ |
| Comparative Example 1 | Active layer, attachment, no working liquid | No operation |
| Comparative Example 2 | Coating (casting) | $1.5 \times 10^{-3}$ |

Examples 2-9

Formation of Transistors with Different Working Liquids, and Evaluation of Physical Properties Transistors comprising active layers made of poly(3-hexylthiophene) were fabricated in the same manner as Example 1, except for the following modifications. Specifically, 65 nm-thick source and drain electrodes were formed for fabrication of the element board 6. Also, the immersion time in the octadecyltrichlorosilane octane solution (6 mmol/l) was 19.5 hours. A poly(3-hexylthiophene) chloroform solution (2 wt %) was used for fabrication of the laminated body 5. Pasting of the laminated body 5 was carried out using the liquids listed in Table 2 instead of methanol as the working liquid 9. Drying removal of the working liquid was accomplished only by standing at 25° C.

Figure 18:
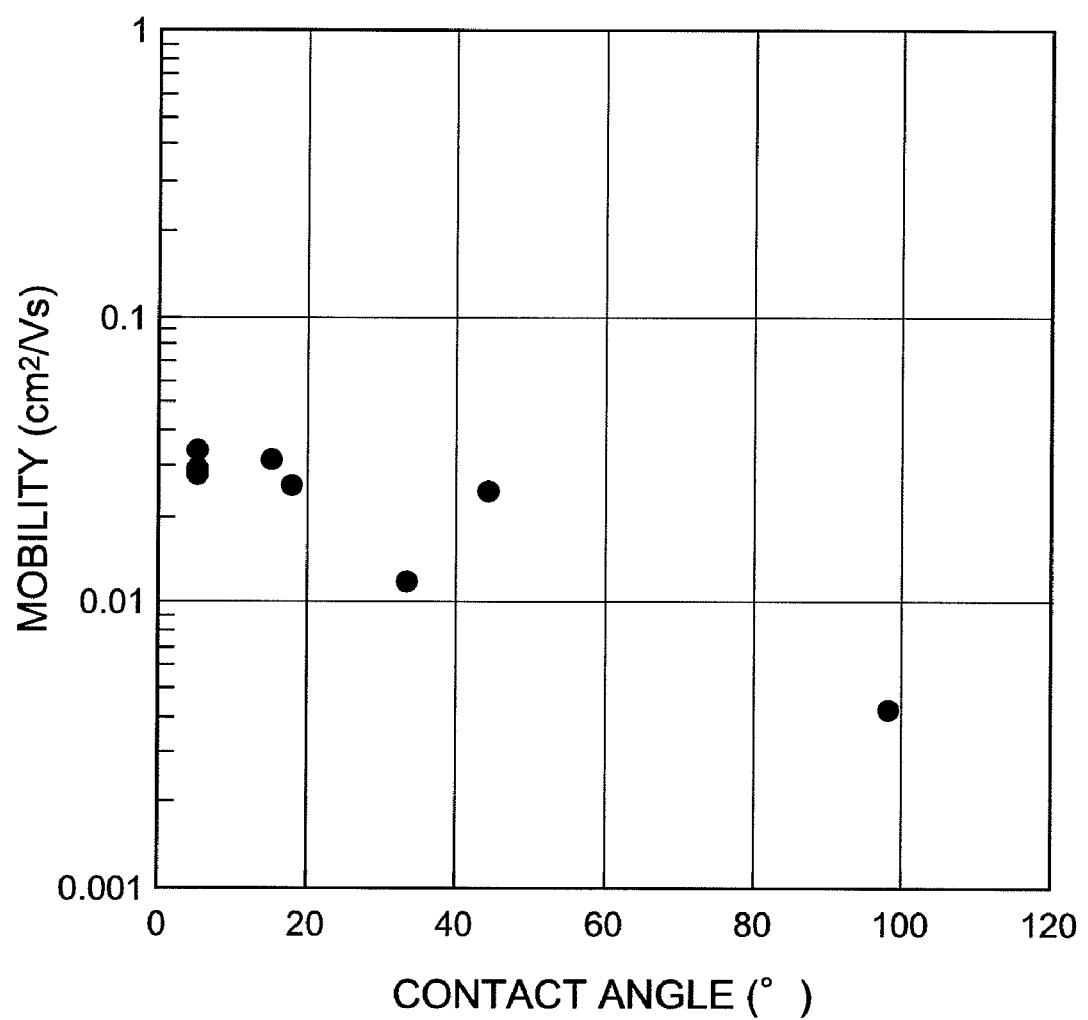
FIG. 18 is a graph showing mobility obtained with transistors obtained using a working liquid, with respect to the contact angle of the working liquid.

To each transistor obtained in this manner there was applied a gate voltage $V_G$ of 40 to −60 V and a source-drain voltage $V_{SD}$ of −60 V in a nitrogen atmosphere, using a silicon substrate 1 as the gate electrode, and the transistor characteristics were measured to determine the mobility of each transistor. The results are shown in Table 2. Table 2 also shows the contact angles (°) of the working liquids used in each example with the insulating layer 3. FIG. 18 is a graph showing the mobility achieved with transistors obtained using each working liquid, plotted with respect to the contact angle of the working liquid.

TABLE 2

| | Working liquid | Contact angle (°) | Mobility (cm²/Vs) |
| --- | --- | --- | --- |
| Example 2 | Water | 98.3 | $4.2 \times 10^{-3}$ |
| Example 3 | Acetone | 17.8 | $2.6 \times 10^{-2}$ |
| Example 4 | Mixture of hexane (4 pts. by wt.) and ethanol (6 pts. by wt.) | ≦10 | $3.4 \times 10^{-2}$ |
| Example 5 | Mixture of toluene (1 pt. by wt.) and methanol (9 pts. by wt.) | 33.4 | $1.2 \times 10^{-2}$ |
| Example 6 | Mixture of chloroform (4 pts. by wt.) and ethanol (6 pts. by wt.) | 15.2 | $3.2 \times 10^{-2}$ |
| Example 7 | Mixture of diethyl ether (6 pts. by wt.) and methanol (4 pts. by wt.) | ≦10 | $2.8 \times 10^{-2}$ |
| Example 8 | Acetonitrile | 44.4 | $2.5 \times 10^{-2}$ |
| Example 9 | Ethyl acetate | ≦10° | $2.9 \times 10^{-2}$ |

During production of each transistor, a working liquid 9 having a smaller contact angle with the insulating layer 3 was able to more easily wet the surface of the insulating layer 3, thus facilitating attachment of the laminated body 5 to the insulating layer 3. As shown in Table 2 and FIG. 18, using a working liquid 9 with a small contact angle increased mobility and yielded a high quality transistor.

Example 10

Formation of Transistor with Heating in the Pasting Step, and Evaluation of Physical Properties A transistor with an active layer made of poly(3-hexylthiophene) was produced in the same manner as Example 8, except that after drying removal of the working liquid (acetonitrile) in the step of attaching the laminated body 5 and element board 6, the element board 6 on which the laminated body 5 had been pasted was placed on a hot plate for heat treatment at 80° C. for 60 minutes in a nitrogen atmosphere. To the transistor obtained in this manner there was applied a gate voltage $V_G$ of 40 to −60 V and a source-drain voltage $V_{SD}$ of −60 V in a nitrogen atmosphere, using a silicon substrate 1 as the gate electrode, and the transistor characteristic was measured to determine the mobility of the transistor. The results are shown in Table 3. As shown in Table 3, heating in the pasting step resulted in satisfactory mobility.

Example 11

Formation of Transistor Using Oriented Active Film, and Evaluation of Physical Properties A transistor with an active layer made of poly(3-hexylthiophene) was produced in the same manner as Example 8, except that after forming the laminated body 5, the laminated body 5 was subjected to stretching and the stretched laminated body 5 was attached to the element board 6. The stretching was accomplished by uniaxial stretching of the formed laminated body 5 to a factor of 2.5 at 100° C. in a nitrogen atmosphere. The attachment was carried out with the stretching direction of the stretched laminated body 5 parallel to the direction in which the source electrode 4a and drain electrode 4b were connected on the element board 6.

The oriented state of the poly(3-hexylthiophene) film 8 of the stretched laminated body 5 was confirmed in the following manner. First, a section of the stretched laminated body 5 was cut and contact bonded with a glass slide heated to 60° C. on a hot plate, with the poly(3-hexylthiophene) film 8 in contact therewith. The support film 7 alone was then released with tweezers to transfer the poly(3-hexylthiophene) film 8 onto the glass slide. The transferred poly(3-hexylthiophene) film 8 was observed with a polarizing microscope. As a result, the poly(3-hexylthiophene) film 8 was confirmed to be oriented in the stretched direction of the laminated body 5.

To the transistor obtained in this manner there was applied a gate voltage $V_G$ of 40 to −60 V and a source-drain voltage $V_{SD}$ of −60 V in a nitrogen atmosphere, using a silicon substrate 1 as the gate electrode, and the transistor characteristic was measured to determine the mobility of the transistor. The results are shown in Table 3. As shown in Table 3, it was confirmed that orienting the active layer results in satisfactory mobility.

Example 12

Figure 19:
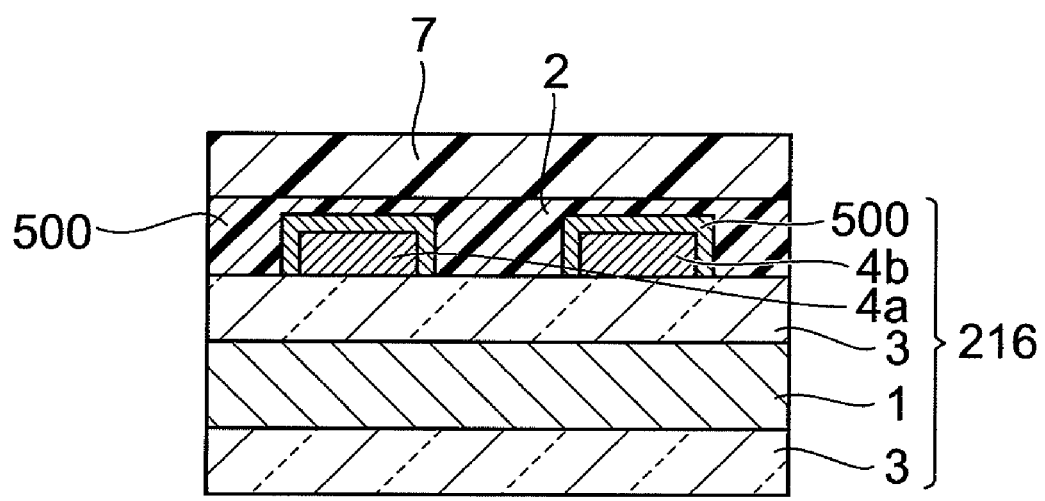
FIG. 19 is a schematic cross-sectional view of the transistor obtained in Example 12.

Formation of Transistor with Layer Between Electrodes and Active Layer, and Evaluation of Physical Properties A transistor with an active layer made of poly(3-hexylthiophene) was produced in the same manner as Example 8, except that the element board used was an element board 216 additionally having a 4-(trifluoromethyl)thiophenol layer 500 formed on the source electrode 4a and drain electrode 4b of the element board 6. This yielded a transistor with a 4-(trifluoromethyl)thiophenol layer 500 between the source electrode 4a and drain electrode 4b and the active layer 2, as shown in FIG. 19. The 4-(trifluoromethyl) thiophenol layer 500 was formed after the element board 6, by dipping the latter in a 4-(trifluoromethyl)thiophenol ethanol solution (1 mmol/L) for 0.5 hour. To the transistor obtained in this manner there was applied a gate voltage $V_G$ of 40 to −60 V and a source-drain voltage $V_{SD}$ of −60 V in a nitrogen atmosphere, using a silicon substrate 1 as the gate electrode, and the transistor characteristic was measured to determine the mobility of the transistor. The results are shown in Table 3. The results in Table 3 confirmed that providing the 4-(trifluoromethyl)thiophenol layer 500 resulted in satisfactory mobility.

TABLE 3

| | Orienting treatment | Heat treatment | With 4-(trifluoromethyl)thiophenol layer 500 | Mobility (cm²/Vs) |
|---|---|---|---|---|
| Example 8 | Not oriented | None | − | $2.5 \times 10^{-2}$ |
| Example 10 | Not oriented | 80° C. × 60 min | − | $4.5 \times 10^{-2}$ |
| Example 11 | Stretching to factor of 2.5 | None | − | $6.8 \times 10^{-2}$ |
| Example 12 | Not oriented | None | + | $1.5 \times 10^{-1}$ |

Examples 13-18

Formation of Transistors with Active Layer Thicknesses, and Evaluation of Physical Properties Transistors with active layers made of poly(3-octylthiophene) were produced in the same manner as Example 10, except that poly(3-octylthiophene) was used instead of poly(3-hexylthiophene), and the heat treatment in the pasting step was carried out at 60° C. for 30 minutes. In Examples 13-18, active layers 2 with different film thicknesses were formed by varying the poly(3-octylthiophene) chloroform solution concentration during formation of the laminated body 5.

To each transistor obtained in this manner there was applied a gate voltage $V_G$ of 20 to −60 V and a source-drain voltage $V_{SD}$ of −60 V in a nitrogen atmosphere, using a silicon substrate 1 as the gate electrode, and the transistor characteristic was measured to determine the mobility of each transistor. The results are shown in Table 4. Table 4 also shows the thicknesses of the active layers 2 of each of the transistors of these examples.

TABLE 4

| | Thickness of active layer 2 (nm) | Mobility (cm²/Vs) |
|---|---|---|
| Example 13 | 11 | $3.8 \times 10^{-4}$ |
| Example 14 | 39 | $1.6 \times 10^{-3}$ |
| Example 15 | 124 | $7.0 \times 10^{-3}$ |
| Example 16 | 280 | $9.5 \times 10^{-3}$ |
| Example 17 | 480 | $1.0 \times 10^{-2}$ |
| Example 18 | 950 | $1.3 \times 10^{-2}$ |

As shown in Table 4, it was confirmed that a larger active layer film thickness resulted in higher mobility.

The invention claimed is:

1. A process for production of a transistor provided with a source electrode and drain electrode, an active layer containing an organic semiconductor compound as a current channel between the electrodes, a gate electrode that controls the current flowing through the current channel and an insulating layer disposed between the active layer and gate electrode, the process being characterized by including a pasting step wherein a working liquid is situated between an active film for forming the active layer and the insulating layer and the active film and the insulating layer are attached together.

2. A process for production of a transistor according to claim 1, wherein the working liquid has a contact angle of no greater than 120 degrees with the insulating layer.

3. A process for production of a transistor according to claim 1, wherein the working liquid has a contact angle of no greater than 90 degrees with the insulating layer.

4. A process for production of a transistor according to claim 1, wherein the active film layer attached in the pasting step is one that has been formed on a support film.

5. A process for production of a transistor according to claim 1, wherein the pasting step is followed by a removal step in which the volatilizing components in the working liquid are removed.

6. A process for production of a transistor according to claim 1, wherein heating and/or pressing are carried out in the pasting step.

7. A process for production of a transistor according to claim 1, wherein the active layer is an oriented active layer.

8. A process for production of a transistor according to claim 1, wherein the transistor has a layer made of a compound different from the organic semiconductor compound between the source electrode and/or drain electrode and the active layer.

9. A process for production of a transistor provided with a source electrode and drain electrode, an active layer containing an organic semiconductor compound as a current channel between the electrodes, and a gate electrode that controls the current flowing through the current channel, the process being characterized by including a pasting step wherein an active film for forming the active layer is attached to a surface on which the active layer is to be formed, with the working liquid situated between the active film and the surface.

10. A process for production of an organic semiconductor element with an active layer containing an organic semiconductor compound, the process being characterized by including a pasting step in which an active film for forming the active layer is attached to a surface on which the active layer is to be formed, with a working liquid situated between the active film and the surface.

11. A transistor comprising a source electrode and drain electrode, an active layer containing an organic semiconductor compound as a current channel between the electrodes, a gate electrode that controls the current flowing through the current channel and an insulating layer disposed between the active layer and gate electrode, wherein an active layer film for forming the active layer and the insulating layer are attached via a working liquid situated between them.

12. A transistor according to claim 11, wherein the working liquid has a contact angle of no greater than 120 degrees with the insulating layer.

13. A transistor according to claim 11, wherein the working liquid has a contact angle of no greater than 90 degrees with the insulating layer.

14. A transistor according to claim 11, wherein the active layer is an oriented active layer.

15. A transistor according to claim 11, which has a layer made of a compound different from the organic semiconductor compound between the source electrode and/or drain electrode and the active layer.

16. A semiconductor device comprising a transistor according to claim 11.

17. A transistor provided with a source electrode and drain electrode, an active layer containing an organic semiconductor compound as a current channel between the electrodes, and a gate electrode that controls the current flowing through the current channel, wherein an active film for forming the active layer is attached to a surface where the active layer is to be formed, with the working liquid situated between the active film and the surface.

18. An organic semiconductor element comprising an active layer containing an organic semiconductor compound, wherein an active film for forming the active layer is attached to a surface on which the active layer is to be formed, with a working liquid situated between the active film and the surface.

19. An organic semiconductor element according to claim 18, wherein the active layer is an oriented active layer.

20. A semiconductor device comprising an organic semiconductor element according to claim 18.

* * * * *